US010419009B2

United States Patent
Shibata

(10) Patent No.: US 10,419,009 B2
(45) Date of Patent: Sep. 17, 2019

(54) RADIO SIGNAL PROCESSING DEVICE, SEMICONDUCTOR DEVICE, AND OSCILLATION FREQUENCY VARIATION CORRECTION METHOD

(71) Applicant: Renesas Electronics Corporation, Tokyo (JP)

(72) Inventor: Kenichi Shibata, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/950,959

(22) Filed: Apr. 11, 2018

(65) Prior Publication Data
US 2018/0367152 A1 Dec. 20, 2018

(30) Foreign Application Priority Data

Jun. 15, 2017 (JP) ................. 2017-117757

(51) Int. Cl.
*H03L 7/10* (2006.01)
*H03L 7/099* (2006.01)
(Continued)

(52) U.S. Cl.
CPC .......... *H03L 7/0992* (2013.01); *H03L 7/0891* (2013.01); *H03L 7/0994* (2013.01);
(Continued)

(58) Field of Classification Search
CPC .................................................... H03L 7/0992
(Continued)

(56) References Cited

U.S. PATENT DOCUMENTS 6,546,060 B1 4/2003 Kawai
9,154,143 B2 10/2015 Ueda et al.
(Continued)

FOREIGN PATENT DOCUMENTS

JP  H11-308285 A  11/1999
JP  5668082 B2  2/2015

*Primary Examiner* — Joseph Chang
(74) *Attorney, Agent, or Firm* — McGinn IP Law Group, PLLC

(57) ABSTRACT

The variation of the oscillation frequency of an oscillator can be suppressed even in the case where the amount of interference with the oscillator accompanied by an amplifying operation of a power amplifier and the polarity are not constant. An oscillator is configured to be capable of oscillating at an oscillation frequency in accordance with control signals Vcont and FREQ_CTRL. A phase locked loop allows the oscillator to output an oscillation signal Vout in synchronization with a reference signal RELCLK using the control signal Vcont. A power amplifier amplifies the electric power of the oscillation signal Vout. A variation detection unit detects a variation with respect to the time change of the control signal Vcont after an amplifying operation is started by the power amplifier causing 3interference with the oscillator. A variation correction unit generates the control signal FREQ_CTRL on the basis of the variation detected by the variation detection unit, and corrects the variation of the oscillation frequency caused by the interference accompanied by the amplifying operation of the power amplifier.

20 Claims, 19 Drawing Sheets

(51) Int. Cl.
*H03L 7/089* (2006.01)
*H03L 7/107* (2006.01)
*H03L 7/18* (2006.01)
*H03L 7/197* (2006.01)

(52) U.S. Cl.
CPC .............. *H03L 7/103* (2013.01); *H03L 7/105* (2013.01); *H03L 7/1075* (2013.01); *H03L 7/1806* (2013.01); *H03L 7/197* (2013.01); *H03L 2207/06* (2013.01); *H03L 2207/50* (2013.01)

(58) Field of Classification Search
USPC ...................................................... 331/117 R
See application file for complete search history.

(56) References Cited

U.S. PATENT DOCUMENTS

| | | | | |
|---|---|---|---|---|
| 2005/0226357 | A1* | 10/2005 | Yoshimura | H03L 7/099 375/376 |
| 2016/0020751 | A1* | 1/2016 | Kozaki | H03H 11/28 455/127.2 |

* cited by examiner

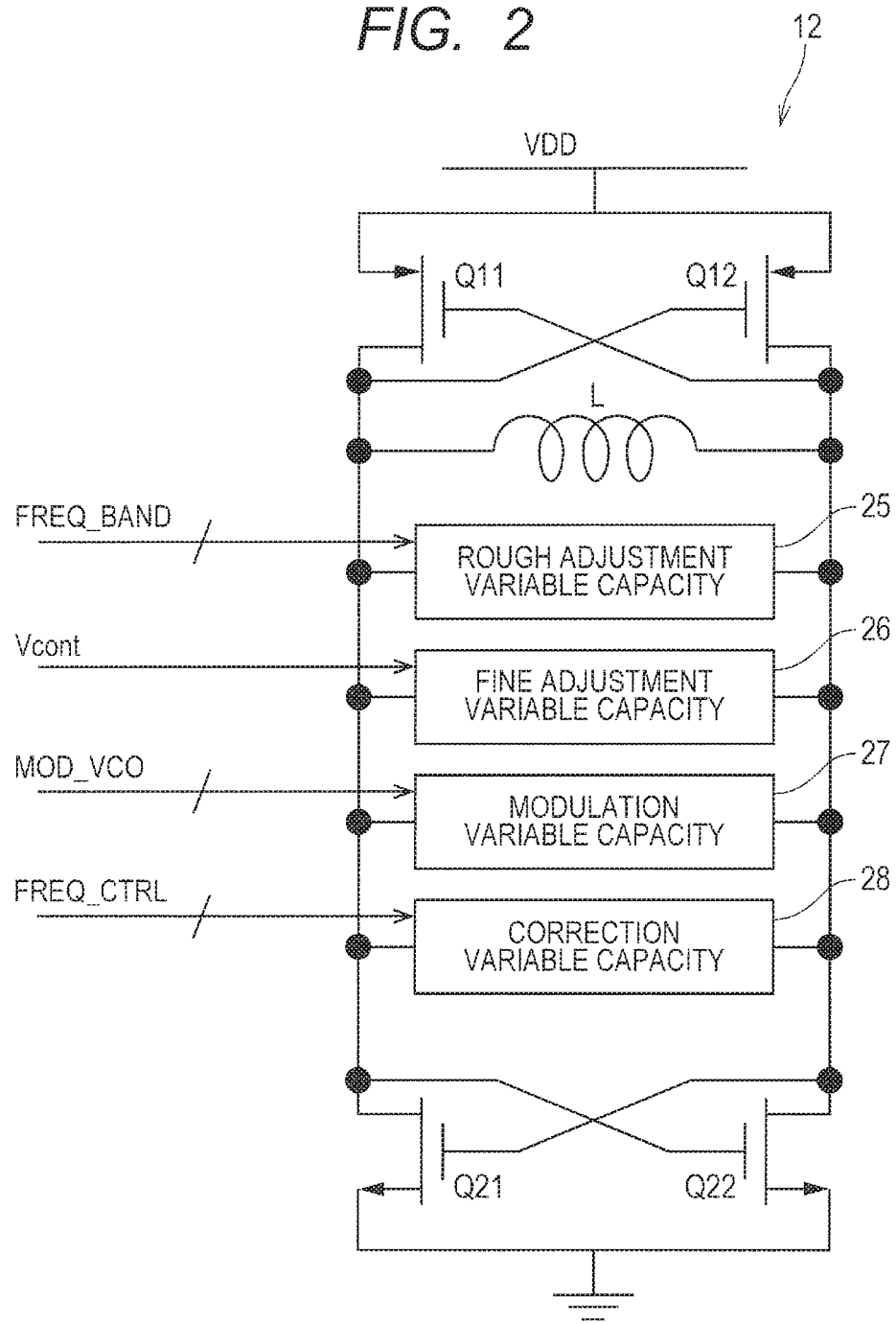

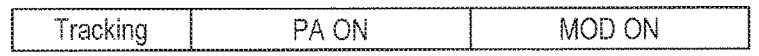
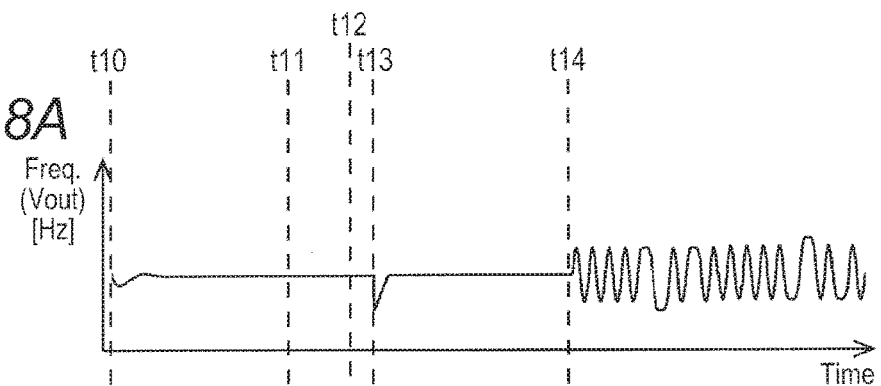
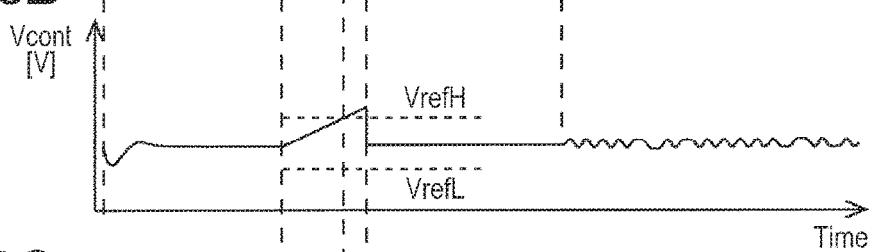
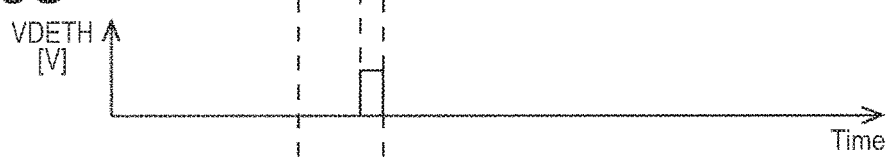
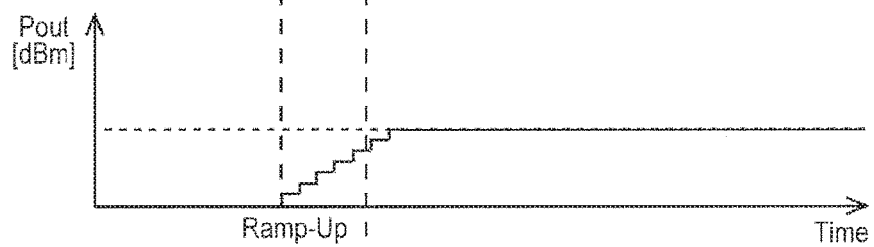
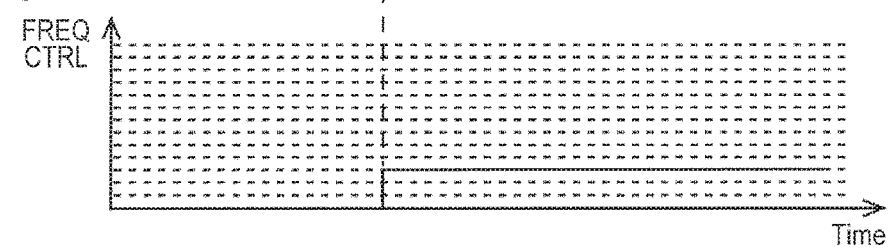

FIG. 14

CORRECTION TABLE

| ΔtDET [μs] | CORRECTION AMOUNT (H) | CORRECTION AMOUNT (L) |
|---|---|---|
| 0.5 | 25 | 25 |
| 1 | 13 | 13 |
| 1.5 | 8 | 8 |
| 2 | 6 | 6 |
| 2.5 | 5 | 5 |
| 3 | 4 | 4 |
| 3.5 | 4 | 4 |
| 4 | 3 | 3 |
| 4.5 | 3 | 3 |
| 5 | 3 | 3 |

RADIO SIGNAL PROCESSING DEVICE, SEMICONDUCTOR DEVICE, AND OSCILLATION FREQUENCY VARIATION CORRECTION METHOD

CROSS-REFERENCE TO RELATED APPLICATIONS

The disclosure of Japanese Patent Application No. 2017-117757 filed on Jun. 15, 2017 including the specification, drawings and abstract is incorporated herein by reference in its entirety.

BACKGROUND

The present invention relates to a radio signal processing device and a semiconductor device, and a radio signal processing device and a semiconductor device including, for example, an oscillator configured so that the oscillation frequency thereof can vary.

Further, the present invention relates to an oscillation frequency variation correction method, and an oscillation frequency variation correction method by which, for example, the variation of the oscillation frequency of the oscillator is corrected.

As an example of related techniques, Japanese Unexamined Patent Application Publication No. Hei 11 (1999)-308285 discloses a direct modulation FSK (Frequency Shift Keying) transmitter for MCA (Multi-Channel Access). The direct modulation FSK transmitter for MCA described in Japanese Unexamined Patent Application Publication No. Hei 11 (1999)-308285 has a phase locked loop (PLL), a voltage controlled oscillator (VCO), and a transmission power amplifier. In Japanese Unexamined Patent Application Publication No. Hei 11 (1999)-308285, the voltage controlled oscillator is controlled so as to allow the phase locked loop to output an oscillation signal having a target frequency for a specific channel.

In the direct modulation FSK transmitter for MCA described in Japanese Unexamined Patent Application Publication No. Hei 11 (1999)-308285, if the electric power supplied to the transmission power amplifier is turned on when radio transmission is started, the input impedance of the transmission power amplifier is changed, and the oscillation frequency of the voltage controlled oscillator arranged in the previous stage of the transmission power amplifier is changed due to a change in the input impedance. Japanese Unexamined Patent Application Publication No. Hei 11 (1999)-308285 describes that in order to suppress the variation of the oscillation frequency when starting the supply of the electric power to the transmission power amplifier, a control signal for turning on or off the transmission power amplifier is added to the voltage controlled oscillator to cancel the variation of the oscillation frequency.

Further, as another example of related techniques, Japanese Patent No. 5668082 discloses an RFIC (Radio Frequency Integrated Circuit) for communications. The RFIC described in Japanese Patent No. 5668082 has a PLL circuit including an LC oscillator. Japanese Patent No. 5668082 describes that in the case where an amplifier in the transmission output stage is switched to on or off, the voltage of a power supply line varies, and the PLL circuit may be unlocked due to the variation of the voltage. In order to solve the problem of the unlocking in Japanese Patent No. 5668082, the capacitance value of the LC oscillator is controlled in accordance with a control signal supplied to the amplifier causing noise. Thereby, the variation of the oscillation frequency due to a change in the state of the amplifier can be suppressed.

SUMMARY

In Japanese Unexamined Patent Application Publication No. Hei 11 (1999)-308285 and Japanese Patent No. 5668082, when the transmission power amplifier is turned on, the oscillation frequency of the oscillator is corrected by a predetermined correction amount. Thereby, it is possible to cancel the variation of the oscillation frequency due to a change in the state of the transmission power amplifier. However, since the correction amount of the oscillation frequency is fixed in Japanese Unexamined Patent Application Publication No. Hei 11 (1999)-308285 and Japanese Patent No. 5668082, there has been a problem that the variation of the oscillation frequency cannot be suppressed in some cases.

The other problems and novel features will become apparent from the description of the specification and the accompanying drawings.

According to an embodiment, a radio signal processing device includes a variation detection unit that detects the variation of a first control signal output by a phase locked loop to an oscillator after an operation of a power amplifier, and a variation correction unit that generates a second control signal on the basis of the detected variation to correct the variation of the oscillation frequency of the oscillator caused by interference accompanied by the amplifying operation of the power amplifier.

According to the above-described embodiment, the variation of the oscillation frequency of the oscillator can be suppressed even in the case where the amount of interference with the oscillator accompanied by the amplifying operation of the power amplifier and the polarity are not constant.

BRIEF DESCRIPTION OF THE DRAWINGS

FIG. 2 is a block diagram for showing a configuration example of an oscillator;

FIGS. 8A-8E are timing charts for showing an operation waveform of each unit of the radio transmission device;

FIG. 14 is a diagram for showing a concrete example of a correction table;

DETAILED DESCRIPTION

Figure 17:
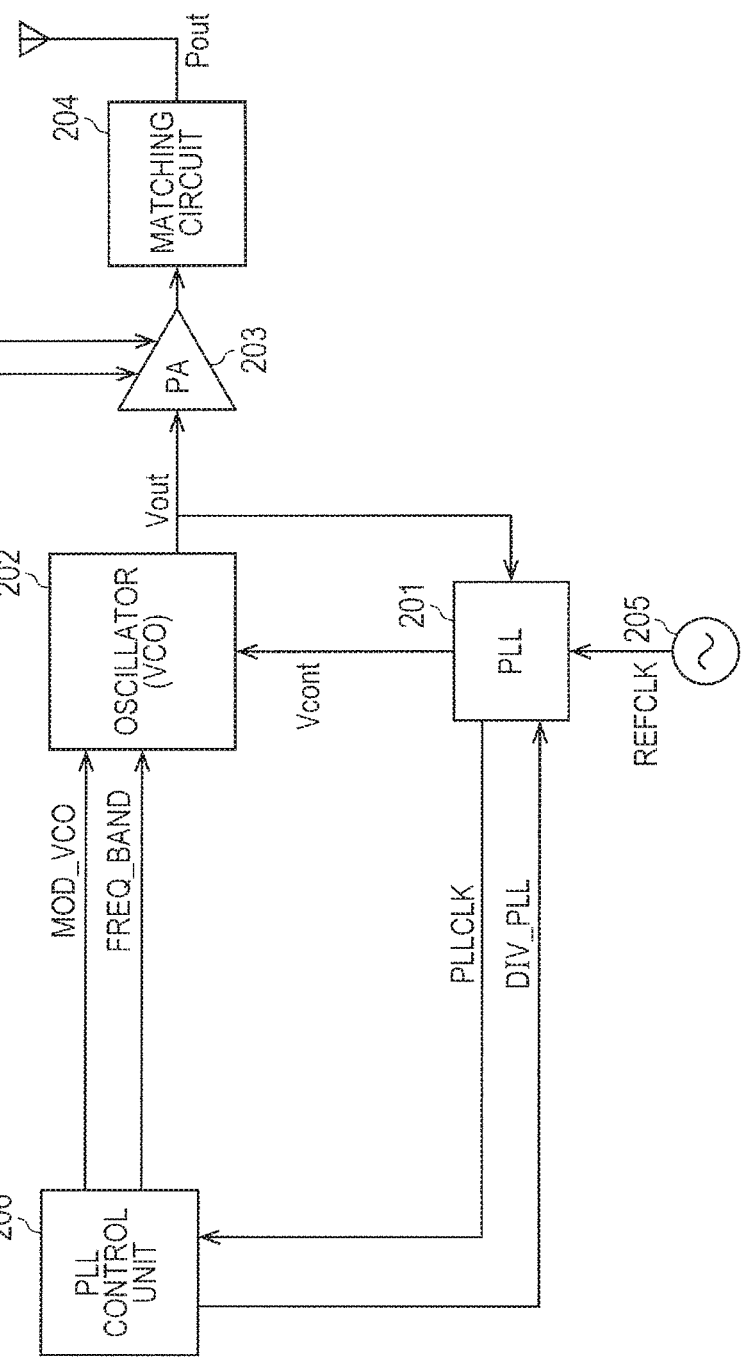
FIG. 17 is a block diagram for showing a radio transmission device used for consideration.

Before describing embodiments, matters considered by the inventions will be described. FIG. 17 shows a radio transmission device used for the consideration. A radio transmission device 200 has a phase locked loop (PLL) 201, an oscillator (VCO) 202, a power amplifier (PA) 203, a matching circuit 204, a reference signal generation circuit 205, a PLL control unit 206, and a PA control unit 207.

The oscillator 202 oscillates at an oscillation cycle in accordance with a control signal (the voltage thereof) Vcont output from the phase locked loop 201, and outputs an oscillation signal Vout. In addition, the oscillator 202 is configured to be capable of adjusting an oscillation frequency in accordance with a control signal FREQ_BAND output from the PLL control unit 206. Further, the VCO 202 is configured to be capable of changing the oscillation frequency in accordance with a control signal MOD_VCO output from the PLL control unit 206.

The phase locked loop 201 includes, for example, a phase frequency detector, a charge pump, a low pass filter, and a divider. The phase locked loop 201 synchronizes the oscillation signal Vout output by the oscillator 202 with a reference signal REFCKL input from the reference signal generation circuit 205 through the control signal Vcont output to the oscillator 202. In addition, the phase locked loop 201 changes the oscillation frequency of the oscillator 202 by changing the frequency division ratio of the divider that divides the oscillation signal Vout in accordance with a control signal DIV_PLL output from the PLL control unit 206. For example, the phase locked loop 201 outputs the output signal of the divider to the PLL control unit 206 as a signal PLLCLK.

The power amplifier 203 amplifies the electric power of the oscillation signal Vout output by the oscillator 202. A signal Pout output by the power amplifier 203 is transmitted from an antenna through the matching circuit 204. In general, the matching circuit 204 includes a balun (balanced/unbalanced) for converting an unbalanced signal output by the power amplifier 203 into a balanced signal.

The PLL control unit 206 controls the phase locked loop 201 and the oscillator 202. The PLL control unit 206 outputs the control signal FREQ_BAND to the oscillator 202, and calibrates the oscillation frequency of the oscillator 202 so that the oscillation frequency of the oscillator 202 becomes a desired frequency. In addition, the PLL control unit 206 changes a signal MOD_VCO output to the oscillator 202 in accordance with transmission data, and modulates the oscillation signal Vout output by the oscillator 202 in accordance with the transmission data. Further, the PLL control unit 206 modulates the oscillation signal Vout output by the oscillator 202 in accordance with the transmission data by changing the signal DIV_PLL output to the phase locked loop 201 in accordance with the transmission data.

The PA control unit 207 controls the power amplifier 203. The PA control unit 207 controls ON/OFF of the power amplifier 203 through a control signal PA_ON output to the power amplifier 203. In addition, the PA control unit 207 controls the amplification degree of a radio signal in the power amplifier 203 through a signal POWER_CODE output to the power amplifier 203. The PA control unit 207 controls the power amplifier 203 so that the transmission electric power of the radio signal is increased in phases by, for example, increasing the value of the control signal POWER_CODE in phases.

For example, a short-range radio system such as BLE (Bluetooth (registered trademark) Low Energy) or ZigBee (registered trademark) employs a configuration in which an output of the oscillator 202 with the oscillation frequency accurately controlled using the phase locked loop 201 is directly input to the power amplifier 203 to reduce the current as shown in FIG. 17. The system is called "direct modulation system. In addition, the radio transmission device 200 shown in FIG. 17 employs a two-points modulation system in which the modulation is performed at two points, in total, of the phase locked loop 201 and the oscillator 202. In the direct modulation system, the frequency frf of the transmission output (Pout) is equal to the oscillation frequency fvco of the oscillator 202.

Here, it has been necessary to reduce the number of components on a printed-circuit-board in recent years, and the matching circuit 204 including the balun for the power amplifier 203 is incorporated into an IC (Integrated Circuit) as a design trend. In the case where the matching circuit 204 is formed in the IC, it is not necessary to mount a component such as an inductor used for the balun on the printed-circuit-board, and the cost of a radio transmitter can be reduced.

In general, the oscillator 202 is configured to include an LC oscillation circuit having an inductor and a capacitor. In addition, the balun is configured to include an inductor. In that case, if the power amplifier 203 outputs a signal with a relatively-high transmission electric power, an interference action such as magnetic coupling occurs between the balun of the matching circuit 204 and the inductor of the oscillator 202. If the oscillation frequency of the oscillator 202 largely varies due to the interference action, there is a problem that the phase locked loop 201 is unlocked.

Figure 18:
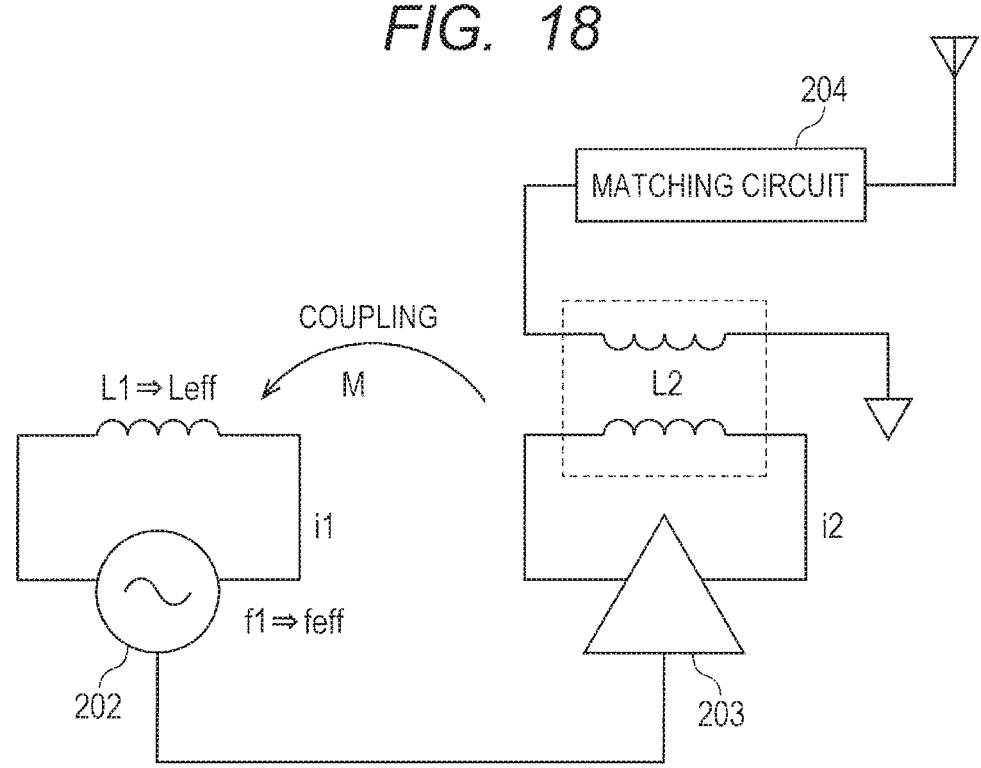
FIG. 18 is a model diagram for explaining an interference action between an oscillator and a matching circuit.

FIG. 18 is a model diagram for explaining the interference action between the oscillator 202 and the matching circuit 204. In FIG. 18, the inductor (the inductance thereof) included in the oscillator 202 is represented by L1, and the inductor (the inductance thereof) included in the matching circuit 204 is represented by L2. In the oscillator 202, it is assumed that a current (AC (Alternating Current)) i1 flows in the inductor L1, and a current (AC) i2 flows in the inductor L2 on the output side (matching circuit 204) of the power amplifier 203.

In the above configuration, if the magnetic coupling occurs between the inductor L1 and the inductor L2, the effective inductance of the inductor L1 is changed from L1 to Leff. The effective inductance Leff is defined by the following equation in which M is a predetermined coefficient.

$$Leff = L1 + (i2/i1)M$$

As being understandable from the above equation, the variation amount of the effective inductance is proportional to the current i2 on the power amplifier 203 side, and is inversely proportional to the current i1 on the oscillator 202 side. Thus, as the amplification degree of the transmission electric power in the power amplifier 203 is higher, namely, as the transmission power is higher, the variation amount of the effective inductance in the oscillator 202 is increased.

The change of the effective inductance acts so as to change the oscillation frequency in the oscillator 202. In the case where the transmission power is not so high, the variation of the effective inductance is relatively small. In that case, even if the oscillation frequency of the oscillator 202 is about to vary in accordance with the variation of the effective inductance, the frequency of the oscillation signal Vout output by the oscillator 202 can be maintained at a constant frequency due to the change of the control signal Vcont output by the phase locked loop 201. However, when the change amount of the oscillation frequency of the oscillator 202 in accordance with the variation of the effective inductance exceeds the lock range allowable value of the phase locked loop 201, the phase locked loop 201 cannot maintain the oscillation frequency of the oscillator VCO 202 at a desired frequency. Namely, the phase locked loop 201 is unlocked.

Figures 19A, 19B, 19C:
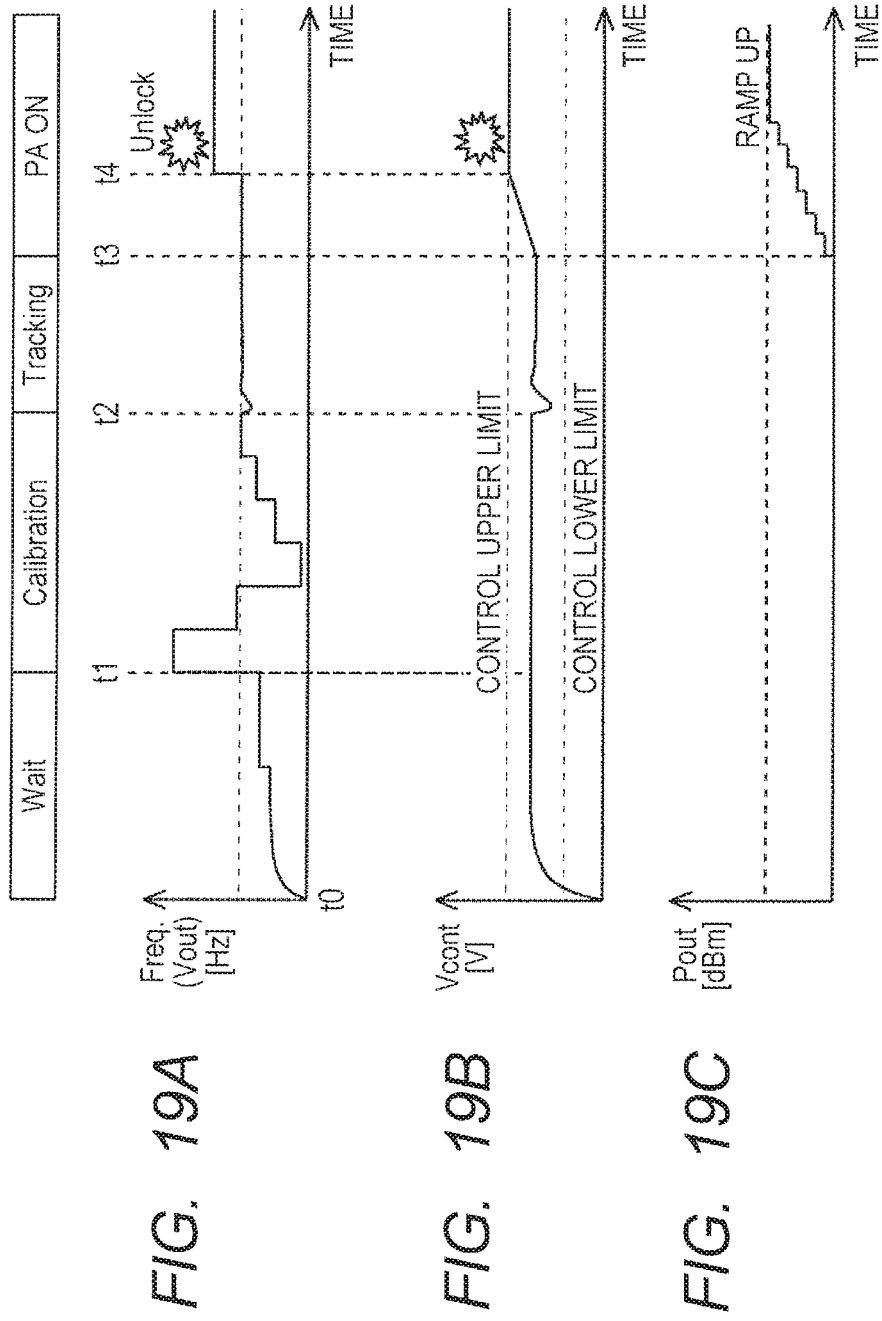
FIGS. 19A-19C are timing charts for showing an example of an operation in the case where unlocking occurs.

FIGS. 19A-19C show an example of an operation in the case where the unlocking occurs. At time t0, the radio transmission device 200 is activated, and an operation at the time of power-on such as bias setting is conducted. At this time, the power amplifier 203 is not activated yet, and the transmission electric power is not amplified (see FIG. 19C). Thereafter, the PLL control unit 206 starts calibration of the oscillation frequency of the oscillator 202 at time t1. The calibration of the oscillation frequency is a rough adjustment operation of the oscillation frequency. In the calibration of the oscillation frequency, the oscillation frequency is monitored while changing the setting of a capacity bank of an LC resonance circuit of the VCO 202 by the control signal FREQ_BAND, and the setting of the capacity bank by which the oscillation frequency becomes close to the target frequency is obtained (see FIG. 19A). In other words, the value of the control signal FREQ_BAND by which the oscillation frequency becomes close to the target frequency is fixed. The calibration of the oscillation frequency is conducted in a state where a feedback loop by the phase locked loop 201 is not formed and the control signal Vcont with a constant voltage is output from the phase locked loop 201.

When the calibration is conducted and the oscillation frequency of the oscillator 202 becomes close to the target frequency, the PLL control unit 206 allows the phase locked loop 201 to operate at time t2. The oscillation frequency of the oscillator 202 is accurately controlled to become the target frequency through a phase pull-in process (tracking operation) of the phase locked loop 201 (see FIG. 19B). This operation is a fine adjustment operation of the oscillation frequency of the oscillator 202, and the phase locked loop 201 allows the oscillation frequency of the oscillator 202 to match the target frequency by changing the control signal (the voltage thereof) Vcont supplied to an analog variable capacity (varactor) included in the oscillator 202.

After the phase locked loop 201 is locked, the PA control unit 207 asserts the control signal PA_ON output to the power amplifier 203 at time t3, and a ramp up operation is started by turning on the power amplifier 203 (see FIG. 19C). The ramp up operation is an operation of increasing the output electric power of the power amplifier 203 in phases by increasing the value of the signal POWER_CODE output to the power amplifier 203 in phases.

When the power amplifier 203 is operated, the oscillator 202 receives interference from the matching circuit 204 as described above. This interference acts so as to vary the oscillation frequency of the oscillator 202. When the oscillation frequency of the oscillator 202 varies, the control signal Vcont output from the phase locked loop 201 to the oscillator 202 is changed (see FIG. 19B), and the frequency of the oscillation signal Vout output by the oscillator 202 is kept constant (see FIG. 19A). For example, if the oscillation frequency is about to lower due to the interference, the phase locked loop 201 keeps the frequency of the oscillation signal Vout output by the oscillator 202 at a predetermined frequency by changing the control signal Vcont to a direction in which the oscillation frequency is increased.

Here, the control signal Vcont has an upper limit value and a lower limit value for controlling, and the phase locked loop 201 cannot output the control signal Vcont having a voltage higher than the upper limit value. In addition, the phase locked loop 201 cannot output the control signal Vcont having a voltage lower than the lower limit value. The upper limit value of the control signal Vcont is equal to, for example, a voltage supplied to the phase locked loop 201.

In the case where the voltage of the control signal Vcont falls within a controllable voltage range, the frequency variation action caused by the interference is absorbed by the change of the control signal Vcont, and the phase locked loop 201 can maintain the lock operation. However, when the control signal Vcont output by the phase locked loop 201 reaches the upper limit value at time t4, the voltage of the control signal Vcont is not increased larger than the upper limit value, and becomes constant (see FIG. 19B). In that case, when the interference amount to the oscillator 202 is increased and the oscillation frequency of the oscillator 202 further varies, the phase locked loop 201 cannot maintain the lock operation and leads to the unlocking (see FIG. 19A).

Due to the problem of the unlocking, it has been impossible to integrate the power amplifier 203 having a certain output or larger into a chip on which the oscillator 202 is mounted. Alternatively, it has been impossible to integrate the matching circuit 204 of the power amplifier 203 causing the magnetic interference into a chip on which the oscillator 202 is mounted. In the case where the power amplifier 203 and the matching circuit 204 are integrated into a chip on which the oscillator 202 is mounted, it has been necessary to lengthen a distance between the oscillator 202 and the power amplifier 203 in order to reduce the magnetic interference, and it has been impossible to reduce the chip size. Further, in that case, due to the necessity of the long-distance transmission of a high frequency signal on the chip, there have been problems such as deterioration in characteristics of the high frequency signal and an increase in electric power consumption. Alternatively, it has been necessary to employ a configuration in which the operating frequency of the oscillator 202 does not match that of the power amplifier 203 by, for example, allowing the oscillator 202 to operate at a frequency twice the frequency frf of the transmission output.

In Japanese Unexamined Patent Application Publication No. Hei 11 (1999)-308285 and Japanese Patent No. 5668082, in order to solve the problem of the unlocking, the oscillation frequency of the oscillator is corrected by a predetermined correction amount when the transmission power amplifier is turned on. However, it is conceivable that the interference amount is changed in accordance with phases, temperatures, process conditions, and the like. Thus, even if the oscillation frequency is corrected by a predetermined fixed amount, the problem of the unlocking cannot be always solved. Since the interference polarity may change, it is conceivable that reverse correction may be performed in fixed correction. As a result of the consideration as described above, the inventors arrived at the embodiments to be described below.

Hereinafter, the embodiments to which means for solving the problems is applied will be described in detail with reference to the drawings. In order to clarify the description, the following description and drawings are appropriately omitted and simplified. In addition, each element illustrated in the drawings as a functional block for performing various processes can be configured using a CPU (Central Processing Unit), a memory, or other circuits as hardware, and can be realized by a program loaded to a memory or the like as software. Thus, a person skilled in the art can understand that these functional blocks can be realized in various forms such as only hardware, only software, or a combination thereof, and are not limited to any one of these. It should be noted that the same elements are followed by the same signs in each drawing, and the duplicated explanation thereof is omitted as needed.

Further, the above-described program can be stored and supplied to a computer using various types of non-transitory computer readable media. The non-transitory computer readable media include various types of tangible storage media. Examples of the non-transitory computer readable media include a magnetic storage medium (for example, a flexible disc, a magnetic tape, or a hard disk), a magneto-optical storage medium (for example, a magneto-optical disc), a CD-ROM (Read Only Memory), a CD-R, a CD-R/W, and a semiconductor memory (for example, a mask ROM, a PROM (Programmable ROM), an EPROM (Erasable PROM), a flash ROM, or a RAM (Random Access Memory)). Further, the program may be supplied to a computer by various types of transitory computer readable media. Examples of the transitory computer readable media include an electrical signal, an optical signal, and an electromagnetic wave. The program can be supplied to a computer by the transitory computer readable media via a wired communication path such as a wire or an optical fiber, or a wireless communication path.

The present invention will be described using the following embodiments while being divided into a plurality of sections or embodiments if necessary for convenience sake. However, except for a case especially specified, the sections or embodiments are not irrelevant to each other, and one has a relationship as a part or all of a modified example, an application, a detailed explanation, or a supplementary explanation of the other. Further, when the specification refers to the number of elements (including the number of pieces, values, amounts, ranges, and the like) in the following embodiments, the number is not limited to the specific number, but may be smaller or larger than the specific number, except for a case especially specified or a case obviously limited to the specific number in principle.

Furthermore, the constitutional elements (including operational steps and the like) are not necessarily essential in the following embodiments except for a case especially specified or a case obviously deemed to be essential in principle. Likewise, when the specification refers to the shapes or positional relationships of the constitutional elements in the following embodiments, the present invention includes the constitutional elements that are substantially close or similar in shapes and the like, except for a case especially specified or a case obviously deemed not to be close or similar in principle. The same applies to the number (including the number of pieces, values, amounts, ranges, and the like).

Furthermore, circuit elements configuring each functional block of the embodiments are not particularly limited, but are formed on a semiconductor substrate such as single-crystal silicon by a well-known integrated circuit technique such as CMOS (Complementary MOS (Metal Oxide Semiconductor)). It should be noted that a MOSFET (Metal Oxide Semiconductor Field Effect Transistor) (abbreviated as MOS transistor) is used as an example of a MISFET (Metal Insulator Semiconductor Field Effect Transistor) in the embodiments, but a non-oxide film is not excluded as a gate insulating film.

First Embodiment

Figure 1:
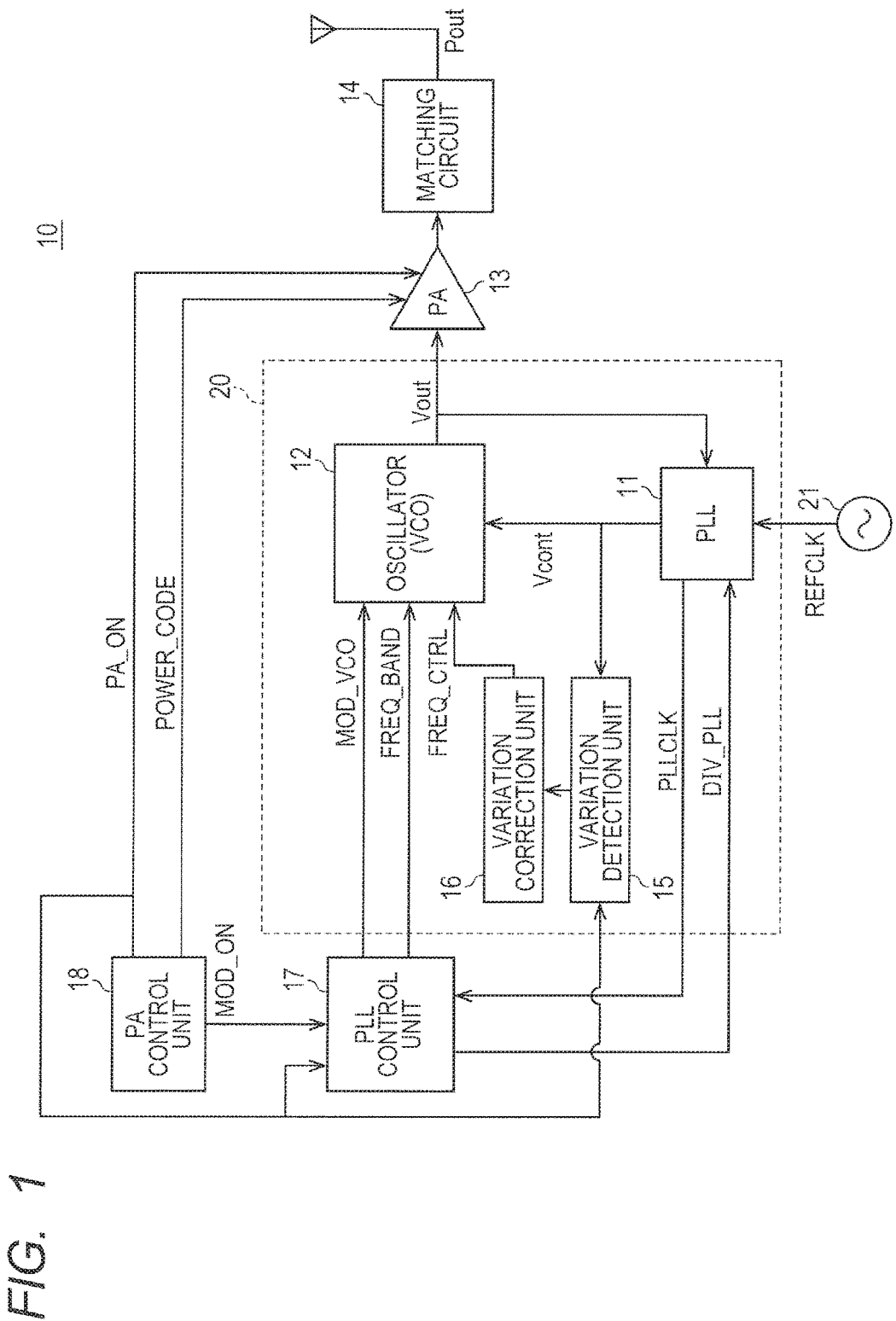
FIG. 1 is a block diagram for showing a radio transmission device including a radio signal processing device according to a first embodiment.

FIG. 1 shows a radio transmission device including a radio signal processing device according to a first embodiment. The radio transmission device 10 has a phase locked loop (PLL) 11, an oscillator (VCO) 12, a power amplifier (PA) 13, a matching circuit 14, a variation detection unit 15, a variation correction unit 16, a PLL control unit 17, a PA control unit 18, and a reference signal generation circuit 21. Among the constitutional elements of the radio transmission device 10, the phase locked loop 11, the oscillator 12, the variation detection unit 15, and the variation correction unit 16 configure a radio signal processing device (high frequency signal processing unit) 20. The radio transmission device 10 according to the embodiment is mainly different from the radio transmission device 200 (see FIG. 17) used for the consideration in that the variation detection unit 15 and the variation correction unit 16 are added.

The oscillator 12 oscillates at a cycle in accordance with a control signal Vcont output from the phase locked loop 11, and outputs an oscillation signal Vout. The phase locked loop 11 generates the control signal Vcont on the basis of the oscillation signal Vout fed back from the oscillator 12 and a reference signal REFCLK output from the reference signal generation circuit 21. The phase locked loop 11 controls the oscillator 12 through the control signal Vcont output to the oscillator 12, and synchronizes the oscillation signal Vout output by the oscillator 12 with the reference signal REFCKL. The phase locked loop 11 is configured using, for example, an analog PLL, and outputs the control signal Vcont that is an analog voltage signal to the oscillator 12. The oscillator 12 is configured as a voltage controlled oscillator the oscillation frequency of which is controlled in accordance with the voltage of the control signal Vcont. The PLL control unit 17 controls the phase locked loop 11 and the oscillator 12.

The power amplifier 13 amplifies the electric power of the oscillation signal Vout output by the oscillator 12. The power amplifier 13 amplifies the oscillation signal Vout (radio transmission signal) in a state where the phase locked loop 11 controls the oscillation signal Vout output from the oscillator 12 to be a predetermined frequency. A signal Pout output by the power amplifier 13 is transmitted from an antenna through the matching circuit 14. The matching circuit 14 includes a circuit for matching impedance and a balun for converting an unbalanced signal output from the power amplifier 13 into a balanced signal. In the embodiment, the oscillator 12 outputs an oscillation signal with the phase or frequency modulated in accordance with transmission data, and the radio transmission device 10 is configured as a device that performs direct modulation using the phase locked loop 11 and the oscillator 12.

The PA control unit 18 controls the power amplifier 13. The PA control unit 18 controls ON/OFF of the power amplifier 13 through a control signal PA_ON output to the power amplifier 13. In addition, the PA control unit 18 controls the amplification degree of a radio signal in the power amplifier 13 through a signal POWER_CODE output to the power amplifier 13. For example, the PA control unit 18 increases the transmission electric power of the power amplifier 13 in phases up to a predetermined electric power by increasing the value of the control signal POWER_CODE in phases. After increasing the transmission electric power up to the predetermined electric power, the PA control unit 18 outputs a control signal MOD_ON to the PLL control unit 17. After outputting the control signal MOD_ON, the PLL control unit 17 performs a modulation operation of the oscillator 12.

[Oscillator]

FIG. 2 shows a configuration example of the oscillator 12. The oscillator 12 has p-type MOS transistors (PMOS transistors) Q11 and Q12, n-type MOS transistors (NMOS transistors) Q21 and Q22, an inductor L, a rough adjustment variable capacity 25, a fine adjustment variable capacity 26, a modulation variable capacity 27, and a correction variable capacity 28. In the oscillator 12, the inductor L, the rough adjustment variable capacity 25, the fine adjustment variable capacity 26, the modulation variable capacity 27, and the correction variable capacity 28 configure an LC resonance-type oscillation circuit. The inductor L, the rough adjustment variable capacity 25, the fine adjustment variable capacity 26, the modulation variable capacity 27, and the correction variable capacity 28 are coupled in parallel between a pair of oscillation output nodes.

In the oscillator 12, the sources of the PMOS transistors Q11 and Q12 are coupled to a power supply voltage VDD. In addition, the gate of one of the PMOS transistors Q11 and Q12 is mutually coupled to the drain of the other. Namely, the gates and drains of the PMOS transistors Q11 and Q12 are coupled to each other in a cross couple connection manner. On the other hand, each of the sources of the NMOS transistors Q21 and Q22 is coupled to a ground power supply voltage GND, and the gates and drains thereof are coupled to each other in a cross couple connection manner. The drains of the PMOS transistor Q11 and the NMOS transistor Q22 and the drains of the PMOS transistor Q12 and the NMOS transistor Q22 are coupled to the pair of oscillation output nodes.

The fine adjustment variable capacity (capacity unit 1) 26 is a variable capacity used for fine adjustment of the oscillation frequency. The fine adjustment variable capacity 26 changes a capacitance value in accordance with the control signal (control signal 1) Vcont output from the phase locked loop 11 (see FIG. 1). The correction variable capacity (capacity unit 2) 28 is a variable capacity used in the case where the variation of the oscillation frequency caused by the operation of the power amplifier 13 is corrected. The correction variable capacity 28 changes a capacitance value in accordance with a control signal (control signal 2) FREQ_CTRL output from the variation correction unit 16.

The modulation variable capacity (capacity unit 3) 27 is a variable capacity used in the case where the oscillation signal Vout is modulated in accordance with the transmission data. The modulation variable capacity 27 changes a capacitance value in accordance with a control signal (control signal 3) MOD_VCO output from the PLL control unit 17. The PLL control unit 17 changes the control signal MOD_VCO in accordance with the transmission data. The oscillator 12 outputs the oscillation signal Vout modulated in accordance with the transmission data by controlling the control signal MOD_VCO input to the modulation variable capacity 27 in accordance with the transmission data.

The rough adjustment variable capacity (capacity unit 4) 25 is a variable capacity used for rough adjustment of the oscillation frequency. The rough adjustment variable capacity 25 changes a capacitance value in accordance with a control signal (control signal 4) FREQ_BAND output from the PLL control unit 17. The control signal FREQ_BAND is adjusted so that the frequency of the oscillation signal Vout becomes a predetermined frequency in the signal range of the control signal Vcont. The PLL control unit 17 outputs the control signal FREQ_BAND to the oscillator 12, and calibrates the oscillation frequency of the oscillator 12 so that the oscillation frequency of the oscillator 12 becomes a desired frequency.

Here, in the embodiment, the control signal Vcont is an analog voltage signal, and each of the control signals FREQ_CTRL, MOD_VCO, and FRQE_BAND is a digital signal having the predetermined number of bits. Further, in the embodiment, the control signal FREQ_CTRL is especially encoded using a thermometer code.

Figure 3A:
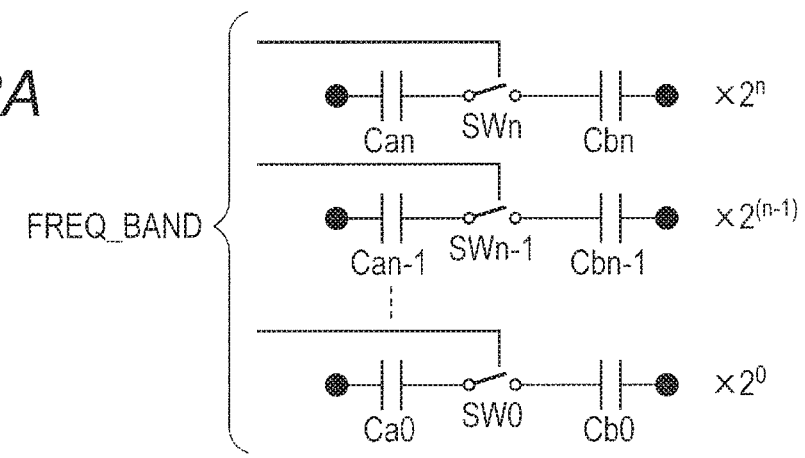
FIGS. 3A to 3C are block diagrams each showing configuration examples of a rough adjustment variable capacity, a fine adjustment variable capacity, and a correction variable capacity.
Figure 3B:
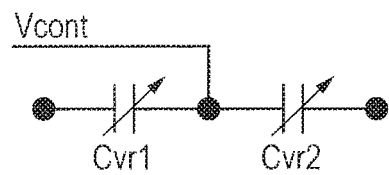
Figure 3C:
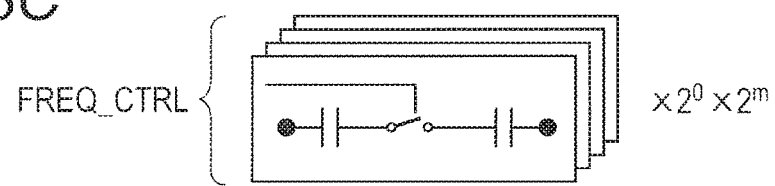

Each of FIGS. 3A to 3C shows configuration examples of the rough adjustment variable capacity 25, the fine adjustment variable capacity 26, and the correction variable capacity 28. The rough adjustment variable capacity 25 includes, as shown in FIG. 3A, a capacity bank having a plurality of circuits in each of which capacitors Ca and Cb are coupled in series through a switch SW between a pair of oscillation output nodes. The control signal FREQ_BAND input to the rough adjustment variable capacity 25 is represented by, for example, an n-bit binary code in which n is a predetermined integer. In that case, the rough adjustment variable capacity 25 has n circuits in each of which capacitors Cai and Cbi are coupled in series through a switch SWi in which i is an integer equal to 1 or larger and equal to n or smaller. The capacitances of the capacitors Cai and Cbi are weighted by a weight in accordance with the bit position. The capacitance value of the rough adjustment variable capacity 25 can be changed in accordance with the control signal FREQ_BAND by controlling the switch SWi in accordance with the value of each bit of the control signal FREQ_BAND. As a result, the oscillation frequency of the oscillator 12 can be controlled in accordance with the control signal FREQ_BAND.

The PLL control unit 17 performs calibration of the oscillator 12 in the open loop state of the phase locked loop 11 (corresponding to time t1 to time t2 of FIGS. 19A-19C). In the calibration, the PLL control unit 17 monitors the frequency of the oscillation signal Vout while changing the control signal FREQ_CTRL supplied to the rough adjustment variable capacity 25 of the oscillator 12, and searches for the control signal FREQ_BAND by which a desired oscillation frequency can be obtained. In other words, the PLL control unit 17 adjusts the control signal FREQ_BAND so that the frequency of the oscillation signal Vout becomes a predetermined frequency. The oscillation frequency of the oscillation signal Vout is roughly adjusted to a predetermined frequency by the calibration.

The fine adjustment variable capacity 26 has, as shown in FIG. 3B, varactors Cvr1 and Cvr2 coupled in series between a pair of oscillation output nodes. The control signal Vcont is input to a connection node between the varactors Cvr1 and Cvr2, and the capacitances of the varactors Cvr1 and Cvr2 are changed in accordance with the magnitude of the voltage of the control signal Vcont that is an analog voltage signal. The oscillation frequency of the oscillator 12 can be controlled in accordance with the control signal Vcont by changing the capacitances of the varactors Cvr1 and Cvr2 in accordance with the control signal Vcont. The range of the oscillation frequency that can be changed by the fine adjustment variable capacity 26 is narrower than that of the oscillation frequency that can be changed by the rough adjustment variable capacity 25. After the calibration, the phase locked loop 11 starts generation of the control signal Vcont on the basis of the oscillation signal Vout fed back from the oscillator 12, and accurately controls the frequency of the oscillation signal Vout to be a desired frequency.

The correction variable capacity 28 includes, as shown in FIG. 3C, a capacity bank having a plurality of circuits in each of which two capacitors and a switch SW are coupled in series between a pair of oscillation output nodes. The control signal FREQ_CTRL is represented by, for example, an m-bit thermometer code in which m is a predetermined integer. One of the differences between the correction variable capacity 28 and the rough adjustment variable capacity 25 is that since the control signal FREQ_CTRL is represented by the thermometer code in the correction variable capacity 28, each capacitor is not weighted in accordance with the bit position. The variation correction unit 16 to be described later generates the control signal FREQ_CTRL and controls the capacitance value of the correction variable capacity 28 in accordance with the control signal FREQ_CTRL, so that the variation of the oscillation frequency of the oscillator 12 after the power amplifier 13 operates is corrected.

It should be noted that the configuration of the modulation variable capacity 27 may be the same as that of the rough adjustment variable capacity 25. However, it is assumed that a change (change in the oscillation frequency) in the capacitance value with respect to a change in the control signal MOD_VCO in the modulation variable capacity 27 is smaller than that in the capacity with respect to a change in the control signal FREQ_BAND in the rough adjustment variable capacity 25. Specifically, for example, in the case where the rough adjustment variable capacity 25 is configured to change the oscillation frequency by a 1 MHz order, the modulation variable capacity 27 may be configured to change the oscillation frequency by a 1 MHz order.

Alternatively, the configuration of the modulation variable capacity 27 may be the same as that of the fine adjustment variable capacity 26. In that case, for example, a DAC (Digital to Analog Converter) for converting the control signal MOD_VCO that is a digital signal into an analog voltage signal may be arranged in a stage before the modulation variable capacity 27. The PLL control unit 17 controls the control signal MOD_VCO in accordance with the transmission data. The oscillation signal Vout output by the oscillator 12 is modulated in accordance with the transmission data by controlling the control signal MOD_VCO in accordance with the transmission data.

[Phase Locked Loop]

Figure 4:
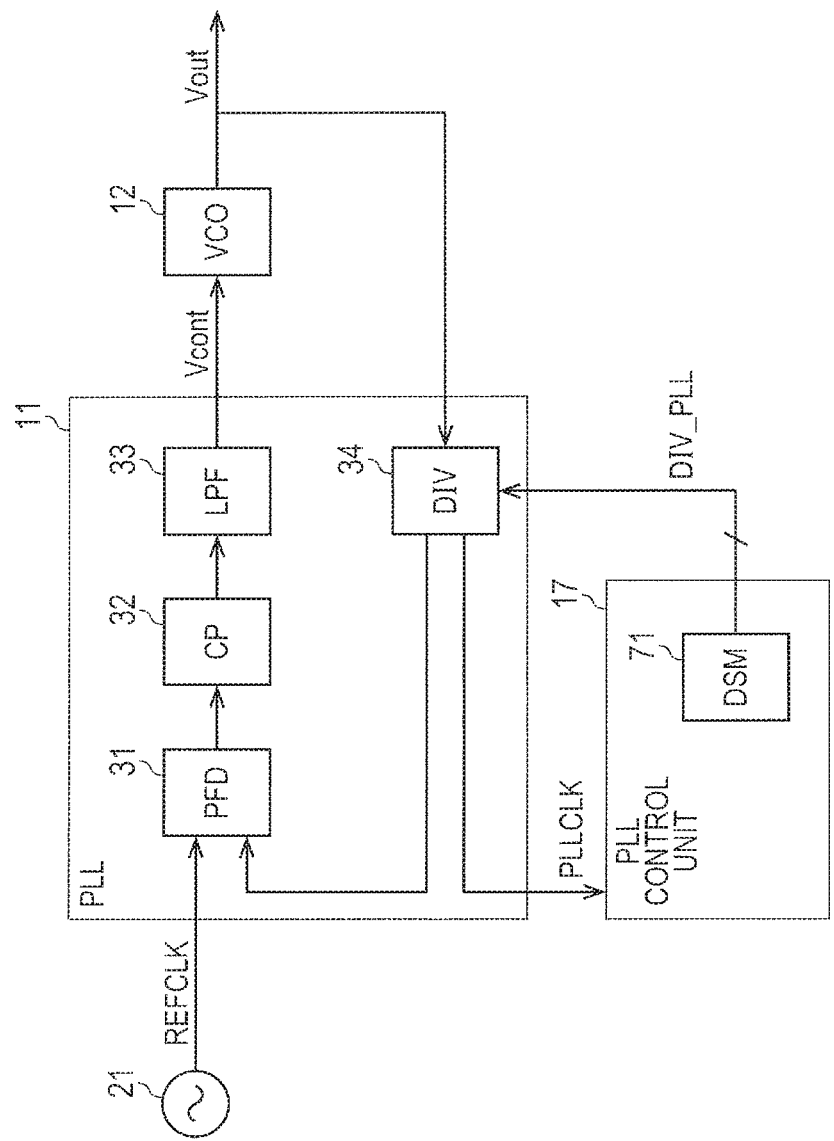
FIG. 4 is a block diagram for showing a configuration example of a phase locked loop.

FIG. 4 shows a configuration of the phase locked loop 11. The phase locked loop 11 has a phase frequency detector (PFD) 31, a charge pump (CP) 32, a lowpass filter (LPF) 33, and a divider (DIV) 34. The divider 34 divides the oscillation signal Vout output by the oscillator 12 at a predetermined frequency division ratio. The oscillation signals Vout (PLLCLK) divided by the divider 34 are input to the phase frequency detector 31 and the PLL control unit 17.

The phase frequency detector 31 compares the oscillation signal Vout fed back through the divider 34 with the reference signal REFCLK output from the reference signal generation circuit 21. The charge pump 32 outputs a signal to the low pass filter (loop filter) 33 in accordance with the comparison result of the phase frequency detector 31. The low pass filter 33 outputs low frequency components of the signal output by the charge pump 32 as the control signal Vcont. Through such an operation, the phase locked loop 11 synchronizes the oscillation signal Vout output by the oscillator 12 with the reference signal REFCLK.

The PLL control unit 17 includes a delta-sigma modulator (DSM) 71, and the delta-sigma modulator 71 outputs a control signal DIV_PLL to the divider 34. The divider 34 changes the frequency division ratio in accordance with the control signal DIV_PLL output from the PLL control unit 17. The delta-sigma modulator 71 controls the control signal DIV_PLL in accordance with the transmission data. The phase locked loop 11 is controlled to change the control signal Vcont in accordance with the transmission data by controlling the frequency division ratio of the divider 34 in accordance with the transmission data, and the oscillation signal Vout output by the oscillator 12 is further modulated in accordance with the transmission data.

[Variation Detection Unit and Variation Correction Unit]

With reference to FIG. 1 again, the variation detection unit 15 monitors the control signal Vcont output by the phase locked loop 11. After the power amplifier 13 that is an interference source of the oscillator 12 starts an amplifying operation, the variation detection unit 15 detects a variation with respect to the time change of the control signal Vcont. The variation detection unit 15 detects, for example, a period of time (period of time 1) from the reference timing related to the start of the amplifying operation in the power amplifier 13 to the time the control signal Vcont reaches a predetermined threshold value. In the embodiment, the variation detection unit 15 detects the variation of the control signal Vcont in a period from the time the power amplifier 13 is turned on to the timing the modulation operation is started in the oscillator 12. The variation detection unit 15 detects a slope with respect to the time change of the control signal Vcont on the basis of the detected time and the predetermined threshold value.

The variation correction unit 16 generates the control signal FREQ_CTRL on the basis of the variation detected by the variation detection unit 15. The variation correction unit 16 estimates the amount of variations of the oscillation frequency of the oscillator 12 caused by the interference of the power amplifier 13 on the basis of, for example, the slope with respect to the time change of the control signal Vcont detected by the variation detection unit 15 and a period of time (period of time 2) from the reference timing related to the start of the amplifying operation in the power amplifier 13 to the timing of the completion of the increase in the amplification factor. The variation correction unit 16 generates the control signal FREQ_CTRL on the basis of the estimated amount of variations of the oscillation frequency. The variation correction unit 16 outputs the generated control signal FREQ_CTRL to the correction variable capacity 28 (see FIG. 2) of the oscillator 12, so that the variation of the oscillation frequency caused by the interference accompanied by the amplifying operation of the power amplifier 13 is corrected.

For example, the variation correction unit 16 changes the oscillation frequency of the oscillator 12 so as to cancel the variation of the oscillation frequency caused by the interference accompanied by the amplifying operation of the power amplifier 13. The control signal Vcont has an upper limit value and a lower limit value for controlling, and the variation correction unit 16 performs the correction so that the control signal Vcont output by the phase locked loop 11 to the oscillator 12 becomes lower than the upper limit value and higher than the lower limit value. For example, the variation correction unit 16 performs the correction so that the control signal Vcont falls within the middle of the signal range thereof. It should be noted that the variation correction unit 16 may be included in the PLL control unit 17.

Figure 5:
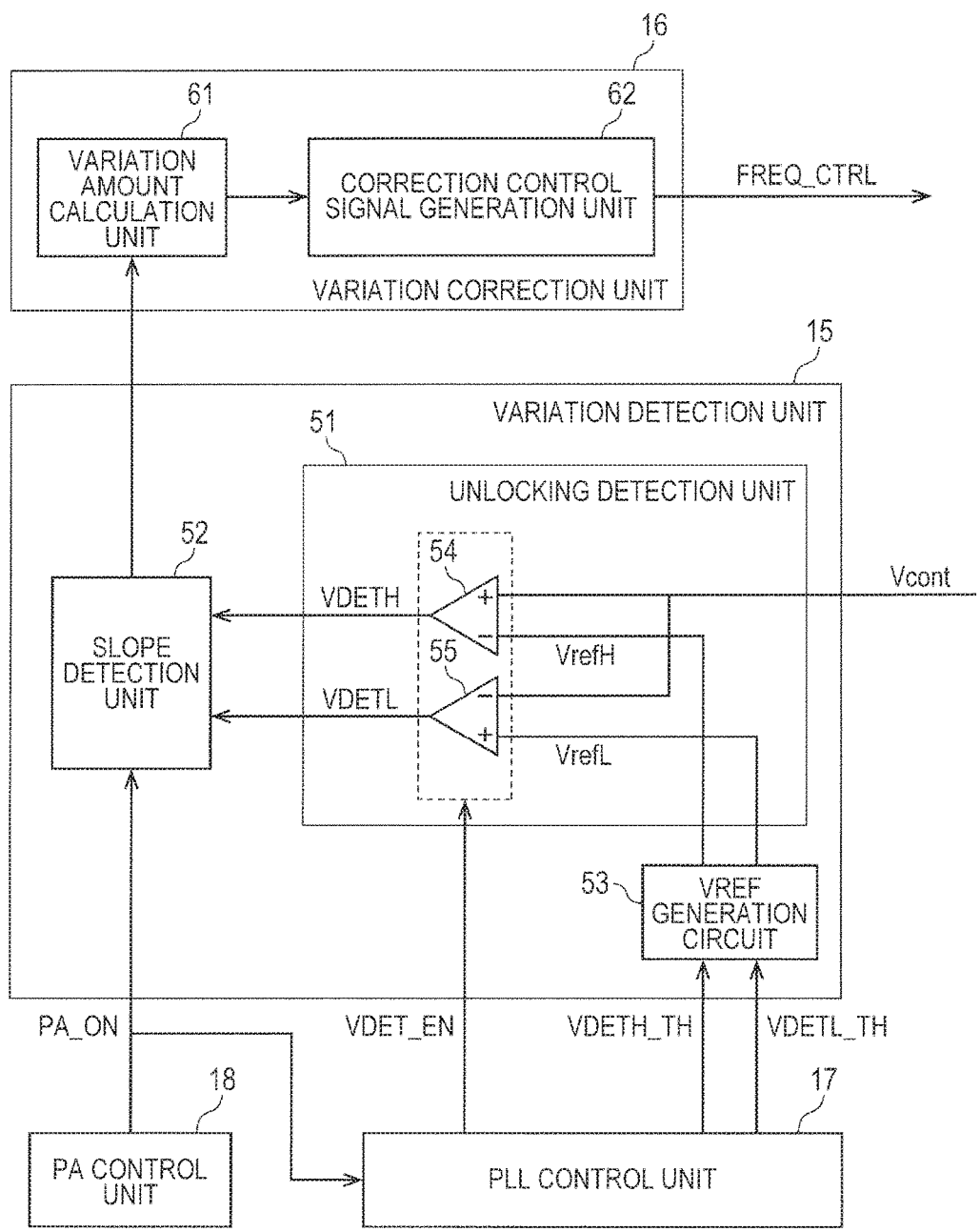
FIG. 5 is a block diagram for showing configuration examples of a variation detection unit and a variation correction unit.

FIG. 5 shows configuration examples of the variation detection unit 15 and the variation correction unit 16. The variation detection unit 15 has an unlocking detection unit 51, a slope detection unit 52, and a reference voltage generation circuit 53. The unlocking detection unit 51 monitors the control signal Vcont to detect whether or not the phase locked loop 11 is about to be unlocked. More specifically, the unlocking detection unit 51 detects whether or not the control signal Vcont becomes close to the upper limit value or the lower limit value for controlling.

The PLL control unit 17 outputs a signal VDET_EN for allowing the variation detection unit 15 to enable the variation detection. For example, when the PA control unit 18 asserts the control signal PA_ON and turns on the power amplifier 13, the PLL control unit 17 asserts the signal VDET_EN. When the PA control unit 18 asserts the control signal MOD_ON, the PLL control unit 17 negates the signal VDET_EN. The unlocking detection unit 51 monitors the control signal Vcont in a period during which the signal VDET_EN is asserted.

The unlocking detection unit 51 includes comparators 54 and 55. The comparator (comparator 1) 54 compares the control signal Vcont with a predetermined threshold voltage (threshold voltage 1) VrefH. When the control signal Vcont becomes the threshold voltage VrefH or higher, the comparator 54 changes a detection signal VDETH from, for example, the L (Low) level to the H (High) level. In other words, the comparator 54 asserts the detection signal VDETH. The comparator (comparator 2) 55 compares the control signal Vcont with a predetermined threshold voltage (threshold voltage 2) VrefL. When the control signal Vcont becomes the threshold voltage VrefL or lower, the comparator 54 asserts a detection signal VDETL. For example, in the case where the signal VDET_EN is asserted, the comparators 54 and 55 compare the control signal Vcont with the threshold voltage.

The reference voltage generation circuit 53 generates the threshold voltages VrefH and VrefL. For example, the PLL control unit 17 outputs to the variation detection unit 15 signals (digital codes) VDETH_TH and VDETL_TH for setting the threshold voltage used for detecting whether or not the phase locked loop 11 is about to be unlocked. The reference voltage generation circuit 53 generates reference voltages VrefH and VrefL on the basis of the signals VDETH_TH and VDETL_TH, respectively. For example, the reference voltage VrefH is set to a voltage slightly lower than the upper limit value of the control signal Vcont for controlling. For example, the reference voltage VrefL is set to a voltage slightly higher than the lower limit value of the control signal Vcont for controlling. The reference voltage generation circuit 53 includes, for example, a resistance voltage-dividing circuit.

The slope detection unit 52 measures a period of time from the reference timing related to the start of the amplifying operation in the power amplifier 13 to the timing the unlocking detection unit 51 outputs the detection signal VDETH or VDETL. The slope detection unit 52 includes, for example, a counter. The counter of the slope detection unit 52 starts a count operation when the control signal PA_ON is asserted. Thereafter, the counter stops the count operation when one of the detection signals VDETH and VDETL is asserted. The count value of the counter corresponds to a period of time from the start of the amplification to the time the control signal Vcont reaches the predetermined threshold voltage. The period of time is changed in accordance with the amount of variations of the oscillation frequency caused by the interference accompanied by the amplifying operation of the power amplifier 13. As the variation of the oscillation frequency is larger, the control signal Vcont reaches the threshold voltage soon, and the period of time measured by the slope detection unit 52 becomes shorter. On the contrary, if the variation of the oscillation frequency is smaller, the change of the control signal Vcont is small, and the period of time measured by the slope detection unit 52 becomes longer. The slope detection unit 52 detects a slope with respect to the time change of the control signal Vcont on the basis of the measured period of time and the threshold voltage VrefH or VrefL.

The variation correction unit 16 has a variation amount calculation unit 61 and a correction control signal generation unit 62. For example, the variation amount calculation unit 61 calculates (estimates) the variation amount of the oscillation frequency caused by the interference accompanied by the amplifying operation of the power amplifier 13 on the basis of the slope with respect to the time change of the control signal Vcont detected by the slope detection unit 52, a period of time from the reference timing related to the start of the amplifying operation in the power amplifier 13 to the timing of the completion of the increase in the amplification factor, and the change amount of the oscillation frequency with respect to the change of the control signal Vcont in the oscillator 12. The correction control signal generation unit 62 generates the control signal FREQ_CTRL on the basis of the variation amount calculated by the variation amount calculation unit 61.

Figure 6:
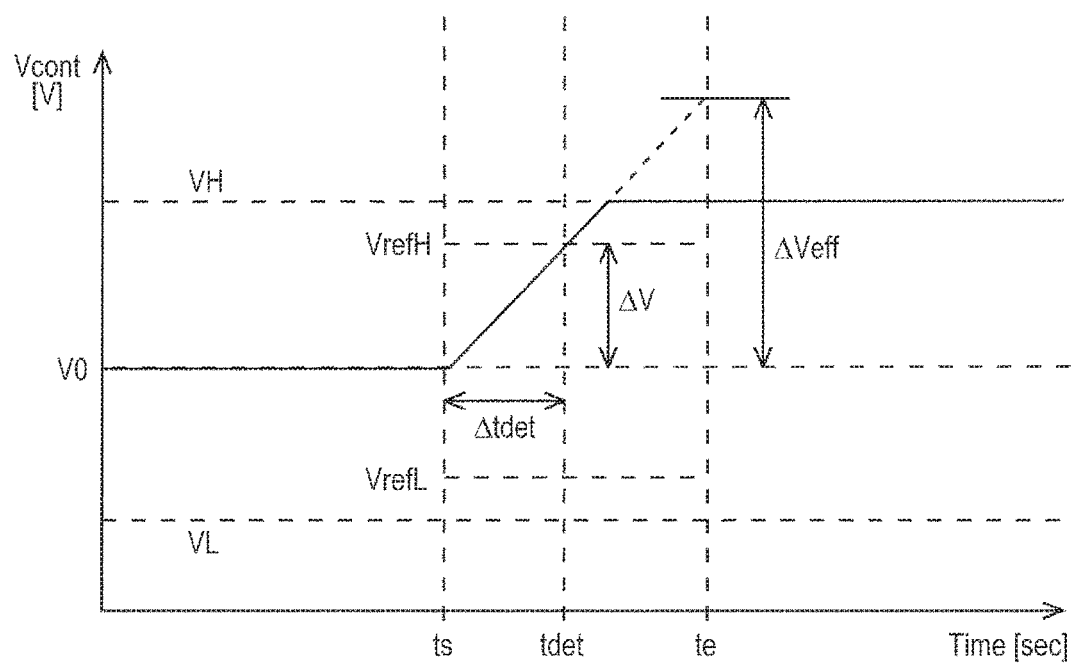
FIG. 6 is a waveform diagram for representing a control signal Vcont.

FIG. 6 is a waveform diagram for showing the control signal Vcont. In FIG. 6, time ts represents time when the power amplifier 13 is turned on to start the amplifying operation, and time te represents time when the increase operation of the amplification factor is completed. Time ts corresponds to time t3 in the timing chart shown in FIGS. 19A-19C, and time te corresponds to the time when the ramp up operation (see FIG. 19C) of the power amplifier 13 is completed. The voltage V0 of the control signal Vcont at time ts is an intermediate voltage between a control upper limit voltage VH and a control lower limit voltage VL.

When the control signal PA_ON is asserted at time ts, the slope detection unit 52 (see FIG. 5) starts time measurement. When the power amplifier 13 starts the amplifying operation, the oscillation frequency of the oscillator 12 is about to vary due to the interference action such as magnetic coupling. The phase locked loop 11 keeps the oscillation frequency of the oscillator 12 at a predetermined frequency by changing the control signal Vcont to be output. In the example of FIG. 6, the phase locked loop 11 raises the control signal Vcont, so that the oscillation frequency of the oscillator 12 is kept at the predetermined frequency.

When the control signal Vcont reaches the threshold voltage VrefH on the high side at time tdet, the comparator 54 outputs the detection signal VDETH. The slope detection unit 52 measures a period of time $\Delta tdet$ from time ts to time tdet when the detection signal VDETH is output. When it is assumed that the change amount of the control signal Vcont from time ts to time tdet is $\Delta V$, $\Delta V$ can be represented by the following equation.

$$\Delta V = VrefH - V0$$

The slope detection unit 52 detects ΔV/Δtdet as a slope with respect to the time change of the control signal Vcont.

If the power amplifier 13 continues the ramp up operation and the interference is further increased in accordance with an increase in the transmission power, the control signal Vcont reaches the control upper limit voltage VH, and the phase locked loop 11 is unlocked (see time t4 of FIG. 19B). It is assumed that a ratio of a change in the control signal Vcont is constant in the variation amount calculation unit 61 (see FIG. 5), and the control signal Vcont can be changed higher than the control upper limit voltage VH. The change amount ΔVeff of the control signal Vcont at time te is estimated on the basis of the assumption. The change amount ΔVeff of the control signal Vcont at time te can be represented by the following equation.

$$\Delta Veff=(\Delta V/\Delta tdet)\times(te-ts)=(VrefH-V0)\times(tdet-ts)/(te-ts)$$

If it is assumed that the polarity of the interference is opposite to the above-described direction, the phase locked loop 11 attempts to keep the oscillation frequency of the oscillator 12 at a predetermined frequency by lowering the control signal Vcont. The slope detection unit 52 measures the period of time Δtdet from time is to the time the comparator 55 outputs the detection signal VDETL. The change amount ΔVeff of the control signal Vcont at time te when it is assumed that the control signal Vcont in that case can be changed lower than the control lower limit voltage VL can be represented by the following equation.

$$\Delta Veff=(\Delta V/\Delta tdet)\times(te-ts)=(VrefL-V0)\times(tdet-ts)/(te-ts)$$

It should be noted that the variation amount calculation unit 61 calculates the change amount ΔVeff of the control signal Vcont using the slope ΔV/Δtdet detected by the slope detection unit 52 in the above description. However, the present invention is not limited thereto. For example, the slope detection unit 52 may output the measured period of time Δtdet to the variation amount calculation unit 61 as a measurement amount corresponding to a slope with respect to the time change of the control signal Vcont. Even in that case, the variation amount calculation unit 61 can calculate the change amount Veff of the control signal Vcont on the basis of the period of time Δtdet in accordance with the above-described equation.

Figure 7A:
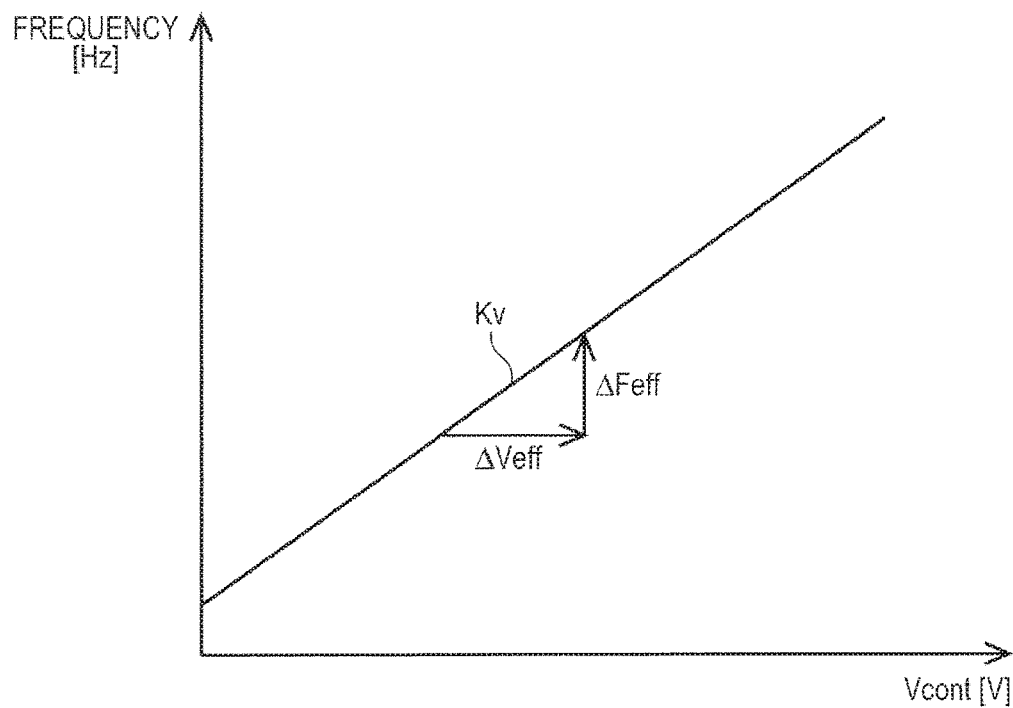
FIG. 7A is a graph for showing a relationship between the control signal Vcont and an oscillation frequency.
Figure 7B:
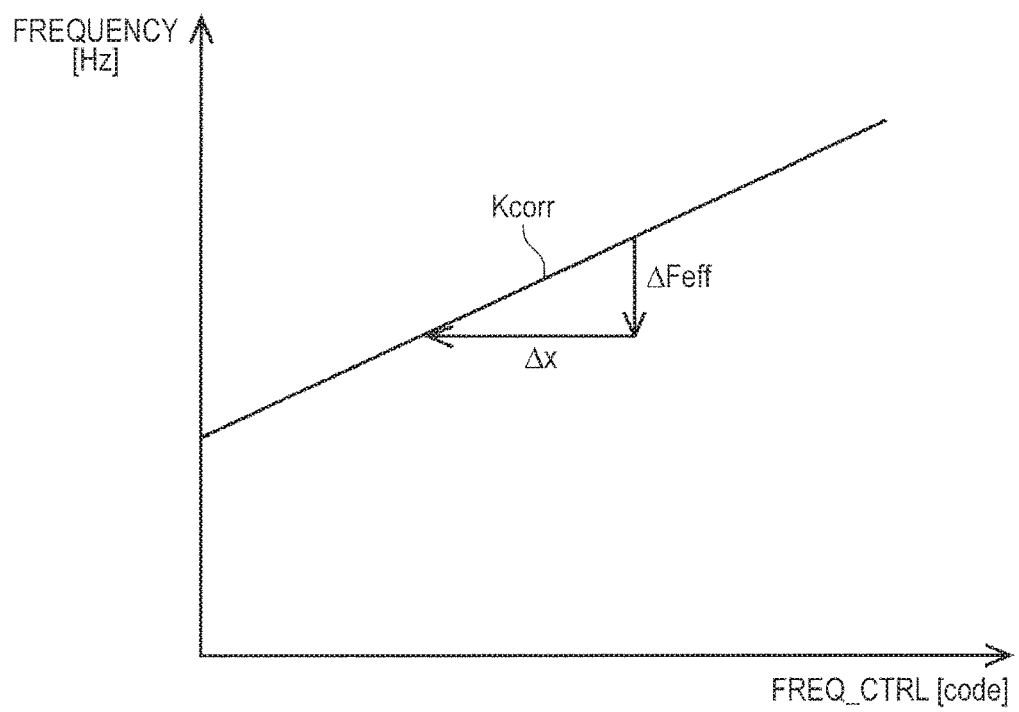
FIG. 7B is a graph for showing a relationship between a control signal FREQ_CTRL and an oscillation frequency.

FIG. 7A shows a relationship between the control signal Vcont and the oscillation frequency in the oscillator 12, and FIG. 7B shows a relationship between the control signal FREQ_CTRL and the oscillation frequency in the oscillator 12. Here, a ratio (slope) of a change in the oscillation frequency to a change in the control signal Vcont is assumed as Kv, and a ratio of a change in the oscillation frequency to a change in the control signal FREQ_CTRL is assumed as Kcorr. It should be noted that an example in which the oscillation frequency is changed with respect to the control signals Vcont and FREQ_CTRL according to a linear function will be described for simplifying the description in FIGS. 7A-7B. However, a relationship between the control signal Vcont and the oscillation frequency and a relationship between the control signal FREQ_CTRL and the oscillation frequency may be represented by a higher-order function.

The variation amount calculation unit 61 (see FIG. 5) estimates the variation amount ΔFeff of the oscillation frequency caused by the interference accompanied by the amplifying operation of the power amplifier 13 at time te on the basis of the change amount ΔVeff of the control signal Vcont and the relationship between the control signal Vcont and the oscillation frequency shown in FIG. 7A. Specifically, the variation amount calculation unit 61 estimates the variation amount ΔFeff of the oscillation frequency at time te according to the following equation.

$$\Delta Feff=Kv\times\Delta Veff$$

For example, if Kv=50 MHz/V, VrefH=0.7V, V0=0.45V, (tdet−ts)=0.5 μs, and (te−ts)=1 μs are satisfied, ΔFeff=50 [MHz/v]×(0.7 [V]−0.45 [V]/0.5 [μs])×(1 [μs])=25 MHz is established.

The correction control signal generation unit 62 generates the control signal FREQ_CTRL on the basis of the variation amount ΔFeff of the oscillation frequency estimated by the variation amount calculation unit 61 and the ratio Kcorr (see FIG. 7B) of a change in the oscillation frequency to the change amount of the control signal FREQ_CTRL in the oscillator 12. Specifically, the correction control signal generation unit 62 calculates the change amount Δx of the control signal FREQ_CTRL according to the following equation, and generates the control signal FREQ_CTRL by increasing or decreasing by only the change amount Δx calculated using the present control signal FREQ_CTRL.

$$\Delta x=-\Delta Feff/Kcorr=-(Kv/Kcorr)\times\Delta Veff$$

For example, if Kcorr=1 MHz/LSB (least significant bit) is satisfied, Δx=25 [MHz]/1 [MHz/LSB]=25 is established.

On the assumption that the control signal Vcont is constant, if the capacitance value of the correction variable capacity 28 is changed in accordance with a change in the control signal FREQ_CTRL, the oscillation frequency of the oscillator 12 is changed by only the change amount of the capacitance value of the correction variable capacity 28. The variation correction unit 16 changes the relationship between the control signal Vcont and the oscillation frequency in the oscillator 12 by only the estimated variation amount of the oscillation frequency by changing the capacitance value of the correction variable capacity 28 using the control signal FREQ_CTRL. Thereby, the variation of the oscillation frequency of the oscillator 12 caused by the interference accompanied by the amplifying operation of the power amplifier 13 can be corrected.

[Operation Example]

Next, an operation example will be described. FIGS. 8A-8E show an operation waveform of each unit of the radio transmission device 10. It should be noted that the operation waveform in the period from time t0 to time t2 of FIGS. 19A-19C is not illustrated in FIGS. 8A-8E. In FIGS. 8A-8E, time t10 corresponds to time t2 of FIGS. 19A-19C when a pull-in operation of the phase locked loop 11 is started. In a period before time t10, the calibration of the oscillator 12 is performed, and the control signal FREQ_BAND input to the rough adjustment variable capacity 25 (see FIG. 2) is adjusted so that the oscillation frequency of the oscillator 12 becomes a desired oscillation frequency in the case where the control signal Vcont is at around the middle level.

When the phase locked loop 11 starts the pull-in operation at time t10, the frequency of the oscillation signal Vout output by the oscillator 12 is accurately controlled to be a predetermined frequency (see FIG. 8A). After the phase locked loop 11 is locked, the PA control unit 18 asserts the control signal PA_ON at time t11, and turns on the power amplifier 13. In addition, the PA control unit 18 increases the output electric power of the power amplifier 13 in phases by increasing the control signal POWER_CODE output to the power amplifier 13 in phases (see FIG. 8D). When the control signal PA_ON is asserted, the slope detection unit 52 (see FIG. 5) of the variation detection unit 15 starts the time measurement.

When the power amplifier 13 operates, the oscillation frequency of the oscillator 12 is about to vary due to the interference affected mainly by the matching circuit 14. The phase locked loop 11 controls the variation of the oscillation frequency of the oscillator 12 by changing the control signal Vcont so that the frequency of the oscillation signal Vout to be fed back becomes constant (see FIG. 8B). In FIG. 8D, the phase locked loop 11 keeps the oscillation frequency of the oscillator 12 at a predetermined frequency by raising the voltage of the control signal Vcont (see FIG. 8A).

The comparator 54 of the variation detection unit 15 asserts the detection signal VDETH when the control signal Vcont reaches the threshold voltage VrefH at time t12 (see FIG. 8C). When the detection signal VDETH is asserted, the slope detection unit 52 stops the time measurement started at time t11. For example, the slope detection unit 52 regards the voltage value of the control signal Vcont at time t11 as the middle voltage value between the control upper limit value and the control lower limit value, and detects a slope with respect to the time change of the control signal Vcont on the basis of the measured time and the threshold voltage VrefH.

The variation amount calculation unit 61 of the variation correction unit 16 estimates the variation amount of the oscillation frequency of the oscillator 12 caused by the interference at the completion time of the ramp up operation in the power amplifier 13 on the basis of the slope detected by the slope detection unit 52. The correction control signal generation unit 62 generates the control signal FREQ_CTRL on the basis of the estimated variation amount, and outputs the generated control signal FREQ_CTRL to the correction variable capacity 28 (see FIG. 2) of the oscillator 12 at time t13 (see FIG. 8E).

The frequency of the oscillation signal Vout of the oscillator 12 varies for a moment when the capacitance value of the correction variable capacity 28 is changed at time t13 (FIG. 8A). However, the phase locked loop 11 changes the control signal Vcont so that the frequency of the oscillation signal Vout becomes the predetermined frequency (see FIG. 8B). Accordingly, the frequency of the oscillation signal Vout returns to the predetermined frequency at the time constant of the phase locked loop. The capacitance value of the correction variable capacity 28 is changed so as to cancel the variation of the oscillation frequency caused by the interference accompanied by the amplifying operation of the power amplifier 13. Accordingly, the voltage of the control signal Vcont returns around the middle between the upper limit value and the lower limit value for controlling, and the locked state of the phase locked loop 11 can be maintained. At this time, the detection signal VDETH output by the comparator 54 is negated (see FIG. 8C).

After the ramp up operation of the power amplifier 13 is completed, the PA control unit 18 asserts the control signal MOD_ON output to the PLL control unit 17 at time t14. When the control signal MOD_ON is asserted, the PLL control unit 17 modulates the oscillation signal Vout output by the oscillator 12 in accordance with the transmission data using the control signal DIV_PLL output to the phase locked loop 11 and the control signal MOD_VCO output to the oscillator 12 (see FIGS. 8A and 8B). The power amplifier 13 amplifies the modulated oscillation signal Vout output by the oscillator 12 to be transmitted from the antenna.

[RFIC]

Figure 9:
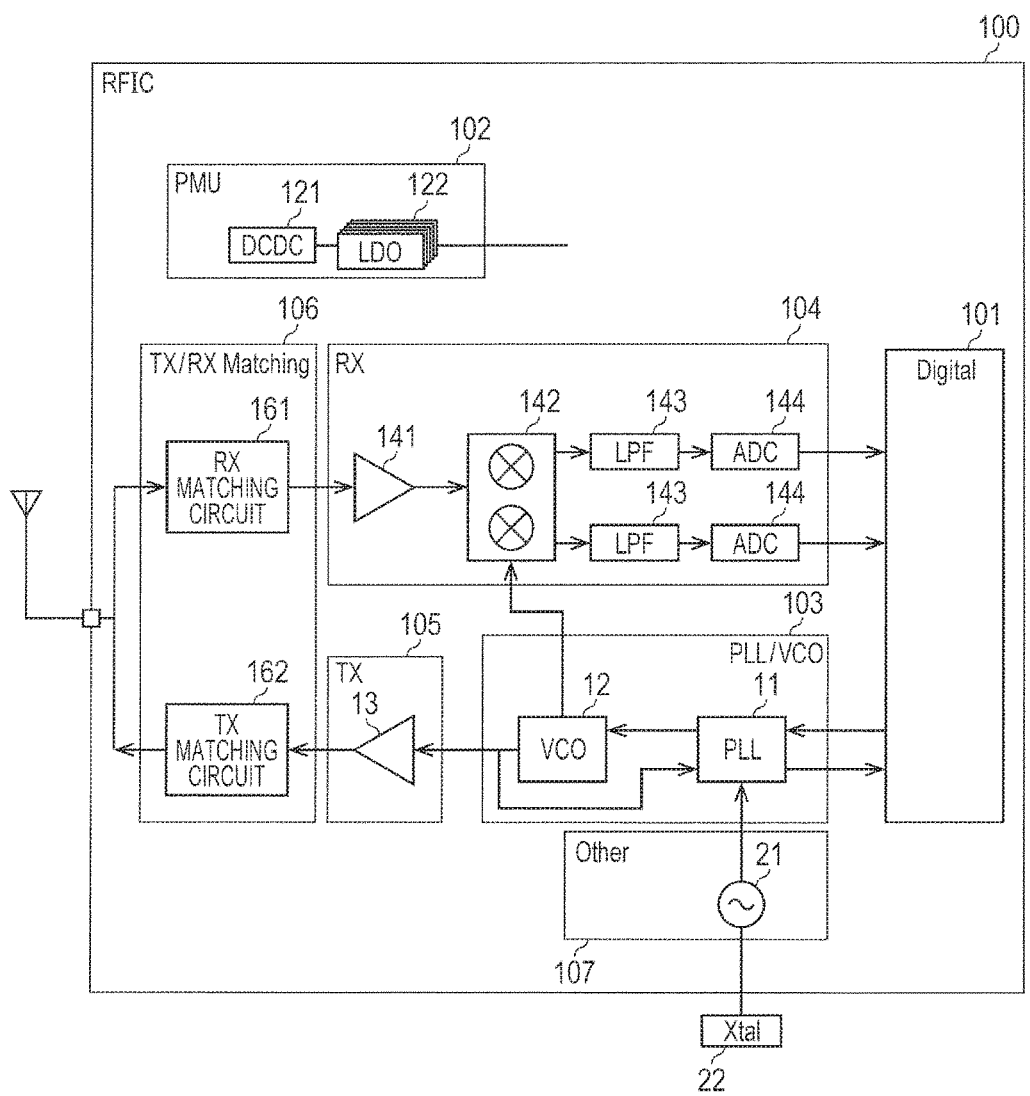
FIG. 9 is a block diagram for showing a semiconductor device including the radio transmission device.

FIG. 9 shows a semiconductor device including the radio transmission device 10 of FIG. 1. A semiconductor device (RFIC) 100 has a digital circuit block 101, a power management module (PMU) 102, a phase locked loop/oscillator block 103, a reception block 104, a transmission block 106, a matching circuit block 106, and an other block 107. The semiconductor device 100 is configured using, for example, one semiconductor chip. The semiconductor device 100 may further has an MCU (Micro Computer Unit) and the like.

The power management module 102 includes, for example, a DC-DC (Direct Current-Direct Current) converter 121, an LDO (Low Drop Out) regulator 122, and the like. The digital circuit block 101 includes, for example, the variation correction unit 16, the PLL control unit 17, the PA control unit 18, and the like shown in FIG. 1. In addition to the above, the digital circuit block 101 may include, for example, a control unit for controlling media access, a control unit for controlling modulation of transmission data and demodulation of reception data, a control unit for controlling the DC-DC converter 121 and the LDO regulator 122, and the like.

The phase locked loop/oscillator block 103 includes the phase locked loop 11, the oscillator 12, and the like. The reception block 104 includes an LNA (Low Noise Amplifier) 141, a mixer 142, a low pass filter 143, and an AD (Analog to Digital) converter 144. The transmission block 105 includes the power amplifier 13. The power amplifier 13 directly amplifies an output signal of the oscillator 12. The other block 107 includes the reference signal generation circuit 21. For example, the reference signal generation circuit 21 generates a reference signal on the basis of a crystal oscillator 22 externally attached to the semiconductor device 100.

The matching circuit block 106 includes a reception matching circuit 161 and a transmission matching circuit 162. A signal received by the antenna is input to the LNA 141 through the reception matching circuit 161. On the other hand, the output signal of the oscillator 12 amplified to a predetermined transmission electric power by the power amplifier 13 is communicated to the antenna through the transmission matching circuit 162 to be transmitted from the antenna. The transmission matching circuit 162 corresponds to the matching circuit 14 of FIG. 1, and includes a balun circuit for converting an unbalanced signal into a balanced signal. It should be noted that the variation detection unit 15, the variation correction unit 16, and the like are not illustrated in FIG. 9. The slope detection unit 52 (see FIG. 5) in the variation correction unit 16 and the variation detection unit 15 is included in, for example, the digital circuit block 101.

It should be noted that an example in which the power amplifier 13 and the transmission matching circuit 162 are mounted in the semiconductor device 100 in which the oscillator 12 is mounted is shown in the above description. However, the present invention is not limited thereto. It is not always necessary to mount the transmission matching circuit 162 in the semiconductor device 100 in which the oscillator 12 is mounted. The transmission matching circuit 162 may be arranged outside the semiconductor device 100. As similar to the above, it is not necessary to mount the power amplifier 13 in the semiconductor device 100 in which the oscillator 12 is mounted. The power amplifier 13 may be arranged outside the semiconductor device 100. Even in the case where the power amplifier 13 and the transmission matching circuit 162 are arranged outside the semiconductor device 100, there is a case that the power amplifier 13 and the transmission matching circuit 162 cause interference with the oscillator 12, and the embodiment can be applied even to such a case.

[Summary]

In the embodiment, the oscillator 12 is configured in such a manner that the oscillation cycle can vary in accordance with the control signal Vcont and the control signal FREQ_CTRL. The phase locked loop 11 operates so as to keep the oscillation signal Vout output by the oscillator 12 at a predetermined frequency through the control signal Vcont. The variation detection unit 15 detects the variation of the control signal Vcont output by the phase locked loop 11 after the amplifying operation of the power amplifier 13 is started. The variation correction unit 16 generates the control signal FREQ_CTRL on the basis of the variation detected by the variation detection unit 15, and outputs the generated control signal FREQ_CTRL to the oscillator 12, so that the variation of the oscillation frequency caused by the interference accompanied by the amplifying operation of the power amplifier 13 is corrected.

When magnetic coupling occurs between the oscillator 12 and the power amplifier 13 and the oscillation frequency of the oscillator 12 largely varies, the phase locked loop 11 is unlocked. In particular, in a direct modulation system, the oscillation frequency of the oscillator 12 is equal to the frequency of the signal amplified by the power amplifier 13. Thus, the effective inductance caused by the interference such as the magnetic coupling largely changes, and the oscillation frequency of the oscillator 12 largely varies. In the embodiment, it is possible to prevent the unlocking of the phase locked loop 11 caused by the magnetic coupling between the oscillator 12 and the power amplifier 13 by correcting the oscillation frequency of the oscillator 12 in accordance with the variation of the control signal Vcont detected by the variation detection unit 15. In particular, in the embodiment, the direction and magnitude of the variation are detected by the variation detection unit 15, and the oscillation frequency is corrected by the variation correction unit 16 on the basis of the detected variation. Even in the case where the amount of interference with the oscillator 12 accompanied by the amplifying operation of the power amplifier 13 and the polarity are not constant, the variation of the oscillation frequency of the oscillator 12 can be suppressed.

In the embodiment, it is possible to prevent the unlocking of the phase locked loop 11 caused by the magnetic coupling between the oscillator 12 and the power amplifier 13. Thus, even in the case where the transmission output of the power amplifier 13 is relatively high, the oscillator 12 and the power amplifier 13 can be mounted on the same chip. In general, in the case of mounting the oscillator 12 and the power amplifier 13 on the same chip, it has been necessary to reduce the interference by lengthening a distance between inductors or by using an inductor having a special shape. In addition, in order to reduce the interference, it has been necessary to allow the oscillator 12 to operate at a frequency twice the frequency frf of the transmission output. In the embodiment, since the variation of the oscillation frequency of the oscillator 12 can be suppressed as described above, it is not necessary to lengthen a distance between the oscillator 202 and the power amplifier 203, and the chip size can be reduced. In addition, since the long-distance transmission of a high frequency signal is not needed on the chip, the characteristic deterioration of the high frequency signal can be suppressed, or an increase in power consumption can be suppressed. Further, in the embodiment, it is not necessary to allow the oscillator 12 to operate at a frequency twice the frequency frf of the transmission output in order to suppress the influence of the interference between the oscillator 12 and the power amplifier 13.

In the embodiment, the variation detection unit 15 detects the variation of the control signal Vcont particularly in a period before the modulation operation is started by asserting the control signal MOD_ON after the control signal PA_ON output by the PA control unit 18 is asserted. In the case where the embodiment is applied to a direct modulation system, the control signal Vcont is changed in accordance with the transmission data after the modulation is started. Therefore, when the variation of the control signal Vcont is detected by the variation detection unit 15 after the modulation is started, there is a possibility of a malfunction. In the embodiment, the signal VDET_EN output by the PLL control unit 17 is asserted only in a period from the asserting of the control signal PA_ON to the asserting of the control signal MOD_ON. Thereby, it is possible to avoid a malfunction caused by detection of the variation of the control signal Vcont by the variation detection unit 15 after the modulation operation is started.

Further, in the embodiment, the thermometer code is used for the control signal FREQ_CTRL. If the capacity bank is weighted with the binary code in the correction variable capacity 28 as similar to the rough adjustment variable capacity 25, an error becomes large when all the bits are inverted. In the embodiment, the thermometer code is used for the control signal FREQ_CTRL changed particularly in a state where the phase locked loop 11 is locked, and thus an error when changing the control signal can be advantageously made smaller.

Second Embodiment

Next, a second embodiment will be described. A configuration of a radio transmission device according to the embodiment is the same as that of the radio transmission device according to the first embodiment shown in FIG. 1. The radio transmission device according to the embodiment is different from that according to the first embodiment mainly in that a digital PLL is used for the phase locked loop 11. The other points may be the same as the first embodiment.

[Digital PLL]

Figure 10:
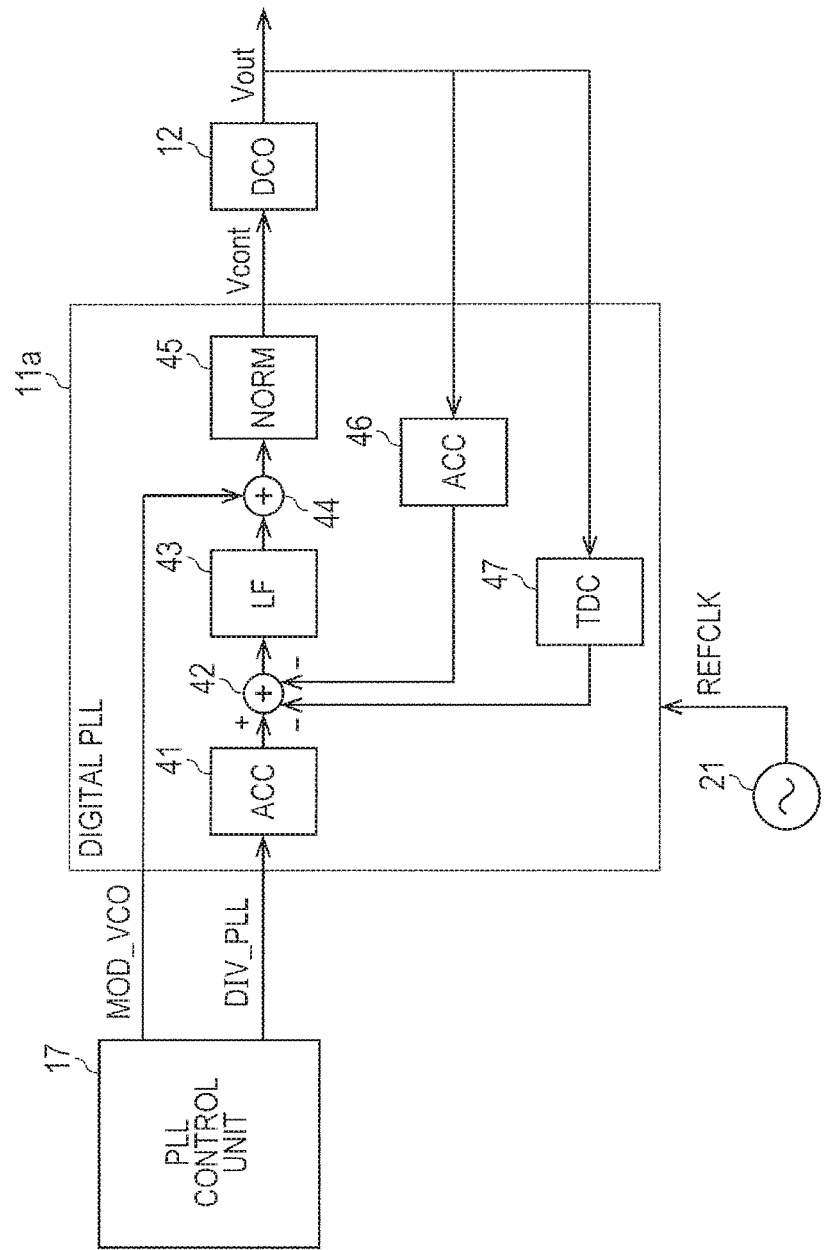
FIG. 10 is a block diagram for showing a configuration example of a digital PLL.

FIG. 10 shows a configuration of a phase locked loop configured as a digital PLL. A phase locked loop 11*a* has an accumulator (ACC) 41, an adder (subtractor) 42, a loop filter (LF), an adder 44, a normalizer (NORM) 45, an accumulator (ACC) 46, and a TDC (time-to-digital converter) 47. The reference signal REFCKL is input from the reference signal generation circuit 21 to the phase locked loop 11*a*.

In the embodiment, the oscillator 12 is configured as a digitally controlled oscillator (DCO) with the oscillation frequency controlled in accordance with a digital signal (digital code). The configuration of the oscillator 12 may be the same as that described in the first embodiment except that the fine adjustment variable capacity 26 (see FIG. 2) is controlled in accordance with a digital signal. In the embodiment, the fine adjustment variable capacity 26 includes a tracking capacity bank same as the rough adjustment variable capacity 25 shown in, for example, FIG. 3A, and the capacitance value thereof is controlled in accordance with the value of the control signal Vcont.

The PLL control unit 17 inputs frequency division information to the accumulator 41 using the control signal DIV_PLL. The accumulator 46 and the TDC 47 calculate the frequency division information of the integer part and the decimal part of the oscillation signal Vout fed back from the oscillator 12. The adder 42 performs an addition or subtraction between an output of the accumulator 41 receiving the control signal DIV_PLL and the frequency division information of the integer part and the decimal part output from the accumulator 46 and TDC 47. The operation result of the adder 42 is smoothed by the loop filter 43 to be input to the normalizer 45 through the adder 44. The normalizer 45 is a normalization circuit that adjusts a loop gain, and an output of the normalizer 45 is input to the oscillator 12 as the control signal Vcont.

In the case where the oscillation signal Vout is modulated, the PLL control unit 17 controls the control signals DIV_PLL and MOD_VCO in accordance with the transmission data. The control signal MOD_VCO is added to an output of the loop filter 43 by the adder 44 to be output to the oscillator 12 through the normalizer 45. The oscillator 12 oscillates at the oscillation frequency in accordance with the control signal Vcont controlled on the basis of the control signals DIV_PLL and MOD_VCO, and thus outputs the oscillation signal Vout modulated in accordance with the transmission data.

[Variation Detection Unit]

Figure 11:
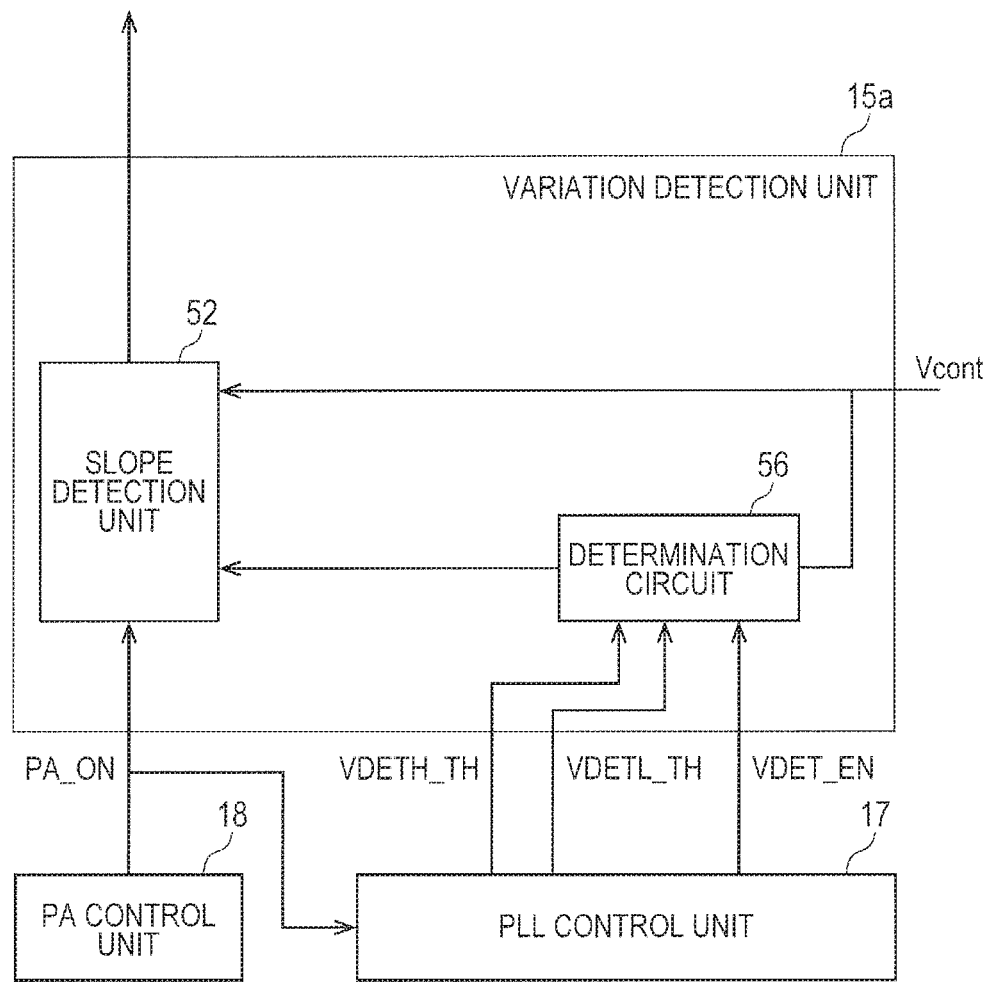
FIG. 11 is a block diagram for showing a configuration example of a variation detection unit that can be used in a second embodiment.

FIG. 11 shows a configuration example of a variation detection unit that can be used in the embodiment. A variation detection unit 15a has a slope detection unit 52 and a determination circuit 56. The determination circuit 56 monitors the control signal Vcont to determine whether or not the control signal Vcont has reached the threshold value. For example, the determination circuit 56 compares the control signal Vcont with the threshold values VDETH_TH and VDETL_TH. The threshold value VDETH_TH is set to, for example, a value smaller than the upper limit value for controlling of the control signal Vcont, and the threshold value VDETL_TH is set to, for example, a value larger than the lower limit value for controlling of the control signal Vcont.

In the case where the control signal Vcont is equal to or larger than the threshold value VDETH_TH, the determination circuit 56 notifies the slope detection unit 52 of the fact that the control signal Vcont has reached the threshold value on the upper side. In addition, in the case where the control signal Vcont is equal to or smaller than the threshold value VDETL_TH, the determination circuit 56 notifies the slope detection unit 52 of the fact that the control signal Vcont has reached the threshold value on the lower side. For example, in the case where the signal VDET_EN is output from the PLL control unit 17, the determination circuit 56 performs the above-described determination.

As similar to the description in the first embodiment, the slope detection unit 52 measures a period of time from the reference timing related to the start of the amplifying operation in the power amplifier 13 to the timing the fact that the control signal Vcont has reached the threshold value in the determination circuit 56 is notified. For example, when the control signal PA_ON output by the PA control unit 18 is asserted, the slope detection unit 52 starts the count operation of the counter. At this time, the slope detection unit 52 stores the value of the control signal Vcont at the timing the control signal PA_ON is asserted. When receiving the notification of the fact that the control signal Vcont has reached the threshold value from the determination circuit 56, the slope detection unit 52 stops the count operation. The slope detection unit 52 detects a slope with respect to the time change of the control signal Vcont on the basis of the value of the control signal Vcont at the timing the control signal PA_ON is asserted, the threshold value VDETH_TH or VDETL_TH, and the count value of the counter. The generation of the control signal FREQ_CTRL in the variation correction unit 16 (see FIG. 5 and the like) may be the same as the first embodiment.

[Another Example of Slope Detection]

In the embodiment, since the control signal Vcont is a digital signal, the degree of freedom of detecting a slope with respect to the time change of the control signal Vcont is high as compared to a case in which an analog voltage signal is used for the control signal Vcont. Instead of detecting the slope on the basis of the period of time required to reach the threshold value, the slope detection unit 52 may monitor the control signal Vcont to detect the slope with respect to the time change of the control signal Vcont on the basis of the magnitude of a change in the control signal Vcont in a predetermined period.

For example, the slope detection unit 52 stores the value of the control signal Vcont at time ts of FIG. 6, and starts the operation of the counter. When the count value of the counter becomes a value corresponding to a predetermined fixed time, the slope detection unit 52 obtains the value of the control signal Vcont, and calculates a difference between the obtained value and the value stored at time ts. The difference represents the change amount of the control signal Vcont in a constant period of time. The slope detection unit 52 outputs the change amount of the control signal Vcont in a constant period of time to the variation amount calculation unit 61.

The variation amount calculation unit 61 estimates the change amount of the control signal Vcont at time te (see FIG. 6) the ramp up of the power amplifier 13 is completed on the basis of the change amount of the control signal Vcont in a constant period of time output by the slope detection unit 52 and a length in a constant period of time. The variation amount calculation unit 61 estimates the variation amount ΔFeff of the oscillation frequency at time te on the basis of the estimated change amount of the control signal Vcont. The correction control signal generation unit 62 calculates the change amount Δx of the control signal FREQ_CTRL on the basis of the variation amount ΔFeff of the oscillation frequency, and generates the control signal FREQ_CTRL.

In the above case, for example, in the case where the determination circuit 56 determines that the control signal Vcont has reached the threshold value VDETH_TH or VDETL_TH, the variation correction unit 16 generates the control signal FREQ_CTRL to correct the variation of the oscillation frequency. Alternatively, in the case where the control signal Vcont is expected to be equal to or larger than the control upper limit or equal to or smaller than the control lower limit at time te the ramp up of the power amplifier 13 is completed, the variation correction unit 16 may correct the variation of the oscillation frequency.

[Summary]

In the embodiment, the digital PLL is used for the phase locked loop 11a. In the embodiment, the phase locked loop 11a can be configured using a digital circuit, and it is possible to benefit from CMOS process miniaturization. Further, it is possible to reduce the area of the phase locked loop as compared to a case in which the phase locked loop is realized using an analog circuit. In addition, since the control signal Vcont is digitalized, elements of variations of the comparator that cause a problem in an analog circuit can be removed, and the accuracy of the determination in the determination circuit 56 can be improved. Further, the variation detection unit 15, the variation correction unit 16, and the like can always monitor the control signal Vcont, and it is conceivable that the degree of freedom of control can be enhanced by, for example, freely setting the threshold value.

[Modified Example]

Figure 12:
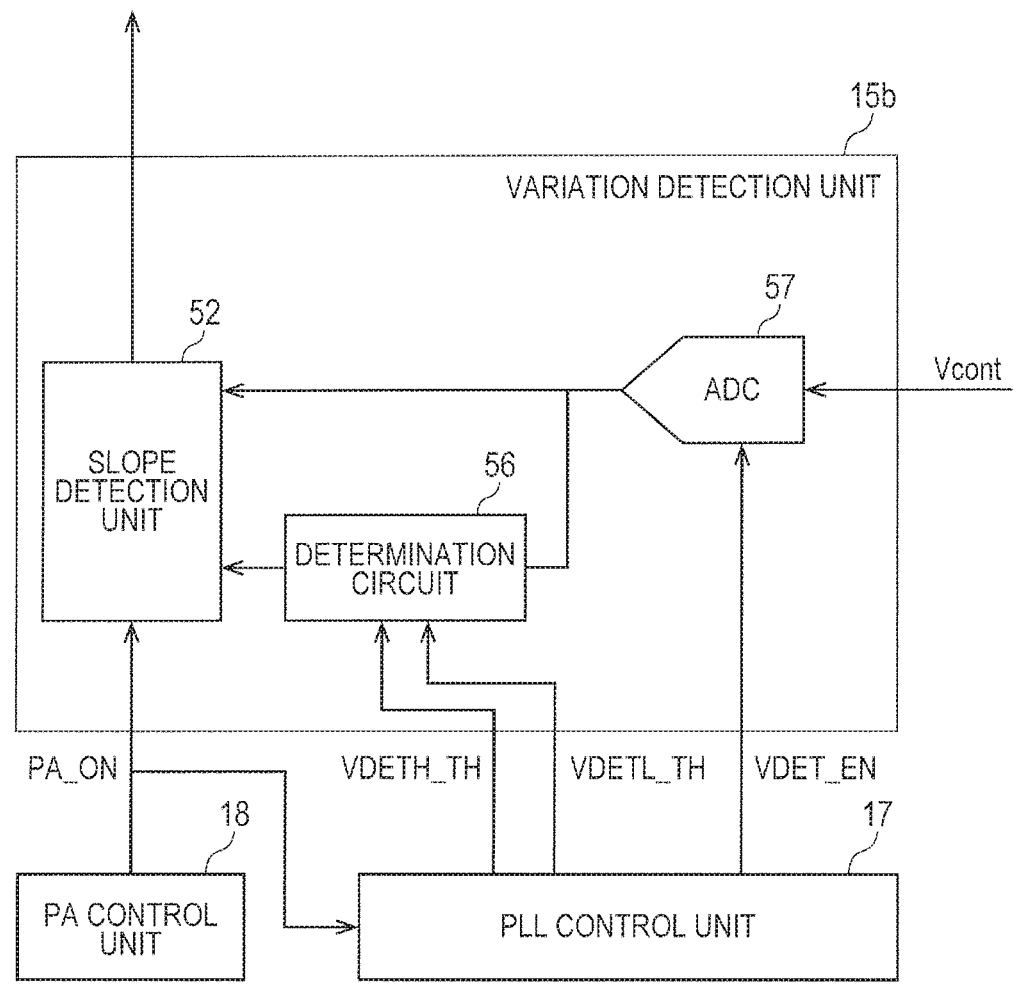
FIG. 12 is a block diagram for showing a configuration example of a variation detection unit in a modified example.

An example of using the digital PLL for the phase locked loop 11a has been described above. However, it is possible to employ a configuration in which the control signal Vcont is digitally processed by the variation detection unit 15 and the like while using the analog PLL. FIG. 12 shows a configuration example of a variation detection unit in a modified example. In the modified example, the phase locked loop 11 is configured using an analog PLL, and the control signal Vcont is an analog voltage signal. A variation detection unit 15b has an AD converter 57 in addition to the configuration of the variation detection unit 15a shown in FIG. 11.

The AD converter 57 converts the control signal Vcont into a digital signal. In the case where the signal VDET_EN is output from the PLL control unit 17, the AD converter 57 converts the control signal Vcont into the digital signal. The determination circuit 56 monitors the control signal Vcont converted into the digital signal by the AD converter 57 to determine whether or not the control signal Vcont has reached the threshold value. The operations of the variation detection unit 15b and the variation correction unit 16 after the control signal Vcont is converted into the digital signal may be the same as those described in the second embodiment.

In the modified example, the control signal Vcont output from the analog PLL is converted into the digital signal using the AD converter 57. Thereby, an effect that can be obtained in the case where the control signal Vcont is a digital signal can be obtained without digitalizing the phase locked loop itself.

Third Embodiment

Next, a third embodiment will be described. A configuration of a radio transmission device according to the embodiment is the same as that of the radio transmission device according to the first embodiment shown in FIG. 1. The radio transmission device according to the embodiment is different from the first embodiment mainly in a method of generating the control signal FREQ_CTRL in the variation correction unit 16. The other points may be the same as the first or second embodiment.

Figure 13:
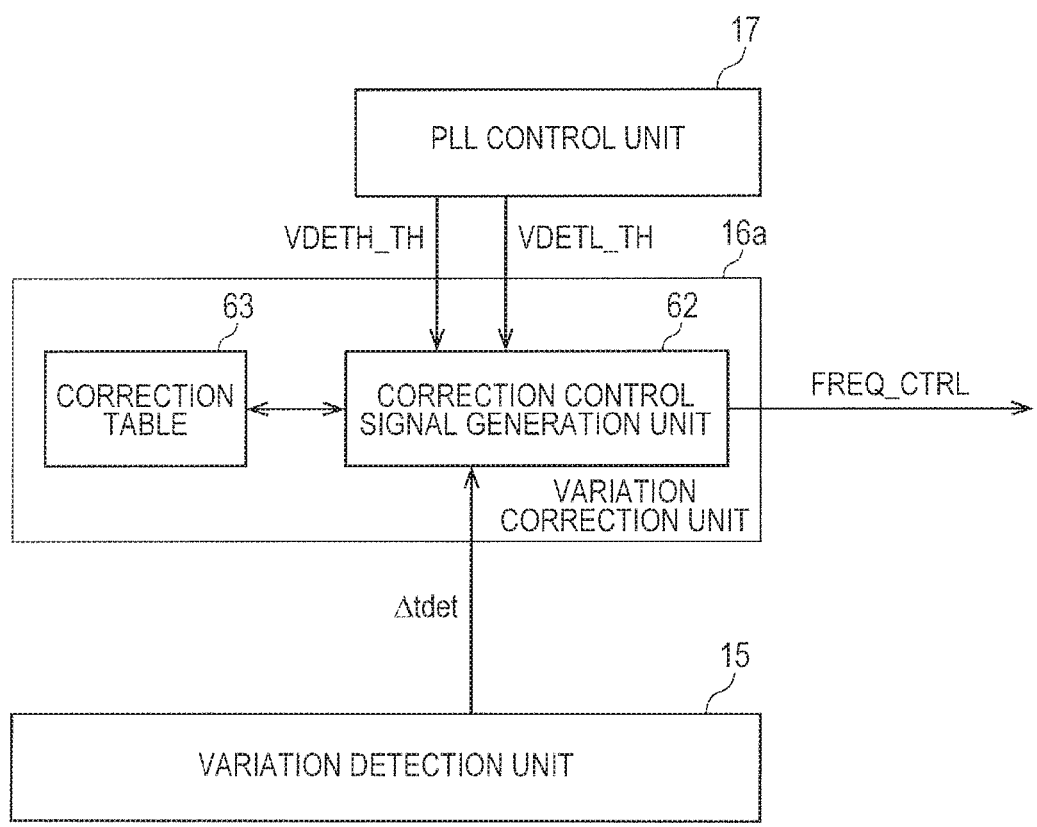
FIG. 13 is a block diagram for showing a configuration example of a variation correction unit in a third embodiment.

FIG. 13 shows a configuration example of a variation correction unit 16a in the embodiment. The variation correction unit 16a has the correction control signal generation unit 62 and a correction table 63. In the embodiment, the variation detection unit 15 measures a period of time (corresponding to Δtdet of FIG. 6) from the reference timing to the timing the control signal Vcont reaches the threshold voltage, and outputs the period of time Δtdet to the variation correction unit 16a. The correction table 63 associates the period of time Δtdet with a value related to the control amount (correction amount) of the control signal FREQ_CTRL, and stores the same. The correction table 63 associates the period of time Δtdet with the control amount (correction amount) of the control signal FREQ_CTRL, and stores the same for each of the threshold voltages VrefH and VrefL used for comparison by, for example, the comparators 54 and 55 (see FIG. 5).

In the embodiment, the correction control signal generation unit 62 obtains the value related to the correction amount corresponding to the period of time Δtdet measured in the variation detection unit 15 from the correction table 63. The correction control signal generation unit 62 generates the control signal FREQ_CTRL using the value related to the correction amount obtained from the correction table 63.

FIG. 14 shows a concrete example of the correction table 63. For example, the correction table 63 stores the change amount Δx (see FIG. 7B) of the control signal FREQ_CTRL while being associated with the period of time Δtdet. The change amount Δx can be calculated using the period of time Δtdet, the threshold voltages VrefH (VDEFH_TH) and VrefL (VDETL_TH). The correction control signal generation unit 62 obtains the change amount Δx corresponding to the period of time Δtdet measured by the variation detection unit 15 from the correction table 63, and generates the control signal FREQ_CTRL by increasing or decreasing the control signal FREQ_CTRL by only Δx.

[Summary]

In the embodiment, the correction control signal generation unit 62 generates the control signal FREQ_CTRL using the value obtained from the correction table 63 by using the correction table 63. By using the correction table 63, the control signal FREQ_CTRL can be generated without calculating the variation amount of the oscillation frequency every time using the variation amount calculation unit 61 (see FIG. 5), and the operation load can be reduced.

[Another Modified Example]

Figure 15:
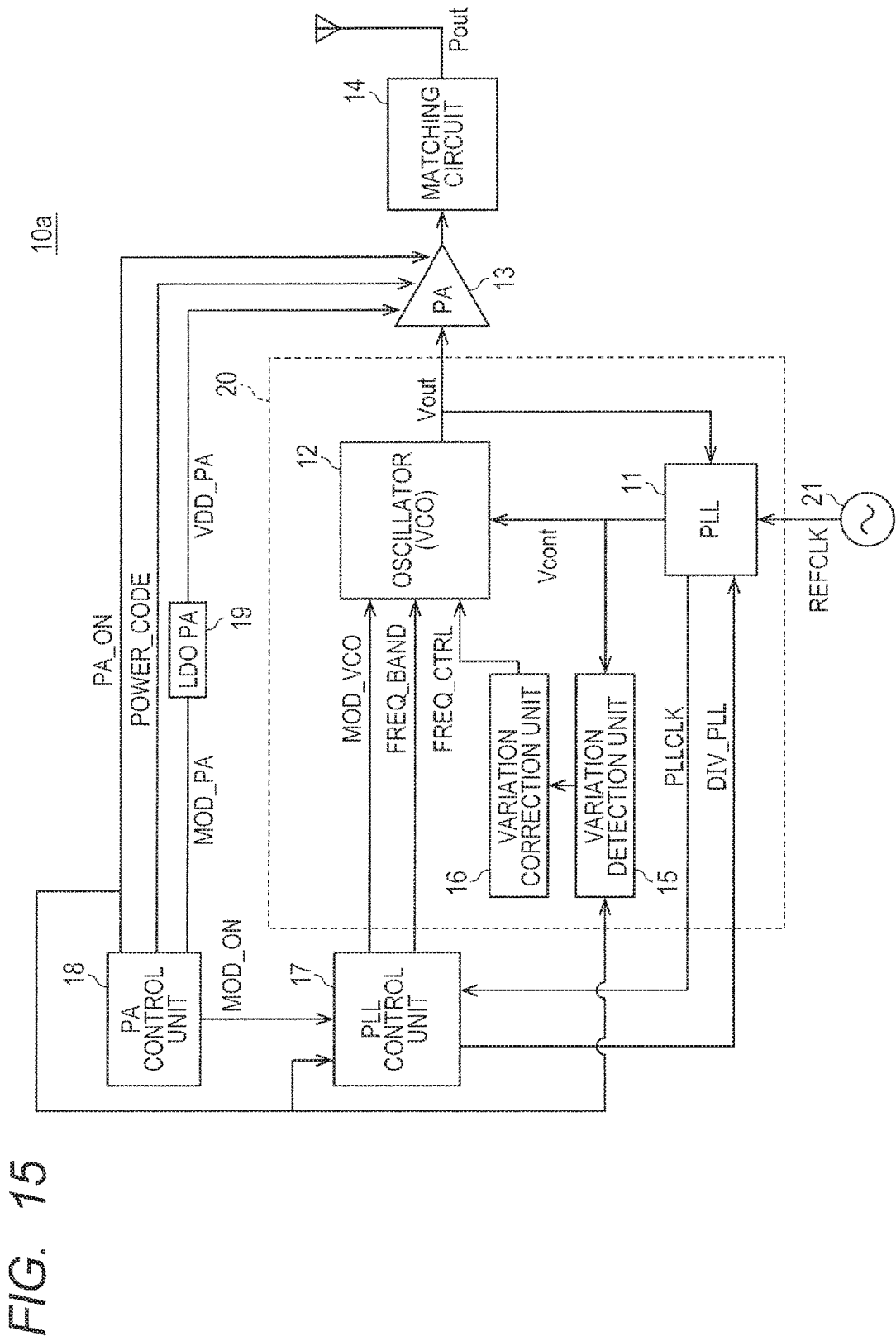
FIG. 15 is a block diagram for showing a radio transmission device of a polar modulation system.

In each of the embodiments, an example in which the frequency or phase of the oscillation signal output by the oscillator 12 is modulated has been described. However, the present invention is not limited to this. In each of the embodiments, a polar modulation system may be employed by adding an amplitude modulation function to the power amplifier 13. FIG. 15 shows a radio transmission device of the polar modulation system. A radio transmission device 10a according to the modified example has an LDO regulator 19 in addition to the configuration of the radio transmission device 10 according to the embodiment shown in FIG. 1. The PA control unit 18 transmits a control signal MOD_PA to the LDO regulator 19. The other points may be the same as the first to third embodiments.

Figure 16:
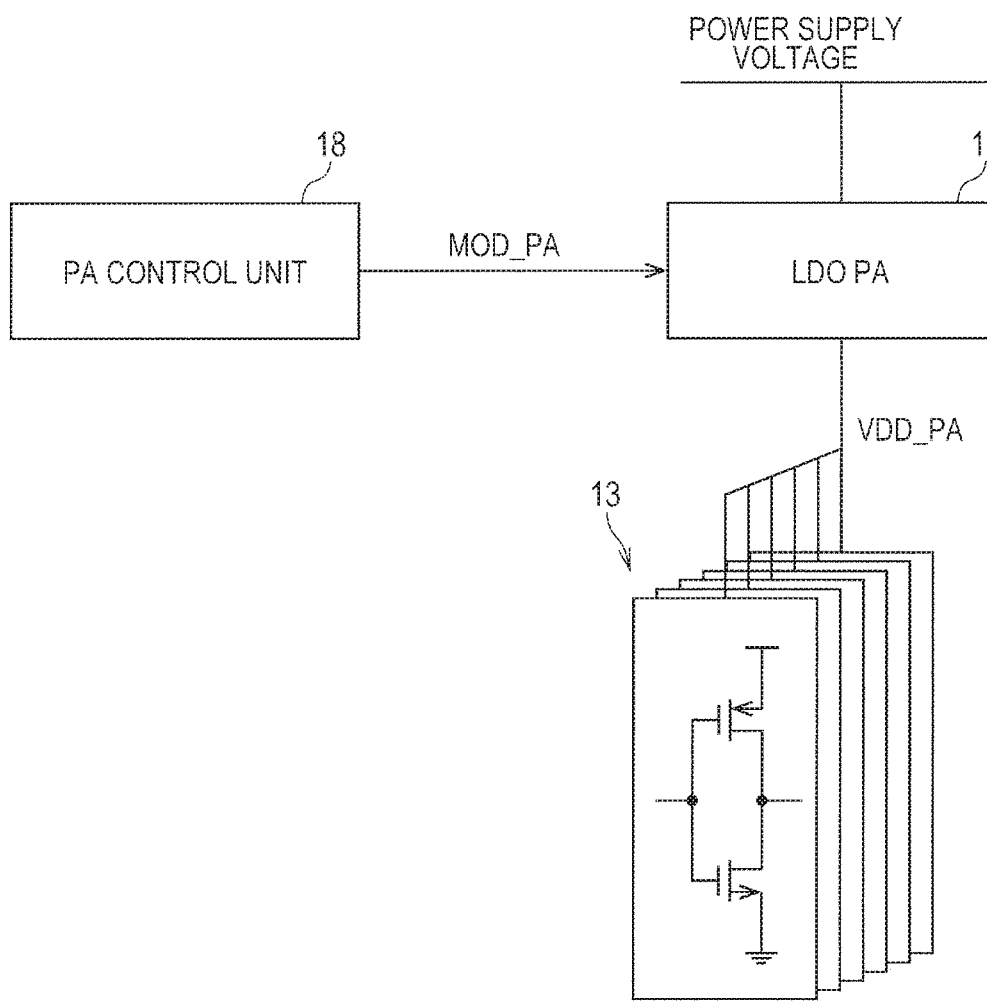
FIG. 16 is a block diagram for showing an LDO regulator and a power amplifier.

FIG. 16 shows the LDO regulator 19 and the power amplifier 13. The power amplifier 13 has, for example, a plurality of inverter output circuits coupled in parallel. The LDO regulator 19 is an LDO regulator for the power amplifier 13, and generates a voltage VDD_PA supplied to the inverter circuits of the power amplifier 13 from the power supply voltage. The LDO regulator 19 changes the voltage VDD_PA in accordance with the control signal MOD_PA. When the power supply voltage VDD_PA is changed, the power amplifier 13 changes the amplitude of an output Pout by only the change amount. The PA control unit 18 changes the control signal MOD_PA in accordance with the transmission data, and modulates the amplitude of the output Pout of the power amplifier 13 in accordance with the transmission data.

[Modulation System]

As modulation systems that can be applied to each of the embodiments, there are nPSK (phase shift keying), MSK (minimum shift keying), GMSK (Gaussian filtered minimum shift keying), and OQPSK (offset quadriphase PSK) in which a phase is used in the primary modulation system. In addition, there are nFSK (frequency shift keying) and nGFSK (Gaussian filtered frequency shift keying) in which a frequency is used in the primary modulation system. In the modified example in which the amplitude can be modulated, in addition to the above, there are nASK (amplitude-shift keying) and OOK (on-off-keying) in which an amplitude is used in the primary modulation system, and there is nQAM (quadrature amplitude modulation) in which a quadrature amplitude is used in the primary modulation system.

The invention achieved by the inventors has been concretely described above on the basis of the embodiments. However, it is obvious that the present invention is not limited to the above-described embodiments, and can be variously changed without departing from the scope thereof.

For example, a part or all of the above-described embodiments can be also described as the following supplementary notes, but are not limited to the followings.

[Supplementary Note 1]

A radio signal processing device comprising:

an oscillator that has a resonance circuit including an inductor, a first capacity unit whose capacitance value can be changed in accordance with a first control signal, and a second capacity unit whose capacitance value can be changed in accordance with a second control signal, and that outputs an oscillation signal having an oscillation frequency in accordance with the resonance frequency of the resonance circuit;

a phase locked loop that controls the oscillator by generating the first control signal to be output to the oscillator, and that allows the oscillator to output the oscillation signal in synchronization with a reference signal;

a variation detection unit that detects a variation with respect to the time change of the first control signal after a power amplifier causing interference with the resonance circuit starts an amplifying operation, the power amplifier amplifying a radio transmission signal on the basis of the oscillation signal in a state where the phase locked loop controls the oscillation signal output by the oscillator at a predetermined frequency; and a variation correction unit that generates the second control signal on the basis of the variation detected by the variation detection unit, and that corrects the variation of the oscillation frequency caused by the interference accompanied by the amplifying operation of the power amplifier by outputting the generated second control signal to the oscillator.

[Supplementary Note 2]

The radio signal processing device according to supplementary note 1, wherein the variation correction unit changes the oscillation frequency so as to cancel the variation of the oscillation frequency caused by the interference of the power amplifier using the second control signal.

[Supplementary Note 3]

The radio signal processing device according to supplementary note 1, wherein the first control signal has an upper limit value and a lower limit value for controlling, and the variation correction unit performs the correction so that the first control signal output by the phase locked loop to the oscillator becomes lower than the upper limit value and higher than the lower limit value after the correction is performed.

[Supplementary Note 4]

The radio signal processing device according to supplementary note 1, wherein the variation detection unit detects a first period of time from the reference timing related to the start of the amplifying operation in the power amplifier to the time the first control signal reaches a predetermined threshold value.

[Supplementary Note 5]

The radio signal processing device according to supplementary note 4, wherein the variation detection unit detects a slope with respect to the time change of the first control signal on the basis of the time until the first control signal reaches the predetermined threshold value and the predetermined threshold value.

[Supplementary Note 6]

The radio signal processing device according to supplementary note 5, wherein the power amplifier is controlled so that the amplification factor is increased in a plurality of stages until the electric power of the radio transmission signal becomes a predetermined electric power, and wherein the variation correction unit estimates the variation amount of the oscillation frequency caused by the interference of the power amplifier on the basis of the slope detected by the variation detection unit and a second period of time from the reference timing to the completion timing of an increase in the amplification factor.

[Supplementary Note 7]

The radio signal processing device according to supplementary note 6, wherein the variation correction unit estimates the variation amount of the oscillation frequency on the basis of the slope detected by the variation detection unit, the second period of time, and the change amount of the oscillation frequency with respect to a change in the first control signal in the oscillator.

[Supplementary Note 8]

The radio signal processing device according to supplementary note 6, wherein the variation correction unit generates the second control signal on the basis of the variation amount of the estimated oscillation frequency and the change amount of the oscillation frequency with respect to the change amount of the second control signal in the oscillator.

[Supplementary Note 9]

The radio signal processing device according to supplementary note 6, wherein the variation correction unit changes a relationship between the first control signal and the oscillation frequency in the oscillator by only the variation amount of the estimated oscillation frequency by outputting the generated second control signal to the oscillator.

[Supplementary Note 10]

The radio signal processing device according to supplementary note 4, wherein the variation correction unit further has a table in which a value related to the correction amount of the correction is stored while being associated with the first period of time, obtains the value related to the correction amount in association with the first period of time detected by the variation detection unit from the table, and generates the second control signal on the basis of the obtained value related to the correction amount.

[Supplementary Note 11]

The radio signal processing device according to supplementary note 1, wherein the second control signal is encoded using a thermometer code.

[Supplementary Note 12]

The radio signal processing device according to supplementary note 1, wherein the oscillator outputs the oscillation signal with the phase or frequency modulated in accordance with transmission data.

[Supplementary Note 13]

The radio signal processing device according to supplementary note 12, wherein the resonance circuit further includes a third capacity unit whose capacitance value is changed in accordance with a third control signal, and the oscillator outputs the oscillation signal modulated in accordance with the transmission data after the third control signal to be input is controlled in accordance with the transmission data.

[Supplementary Note 14]

The radio signal processing device according to supplementary note 13, wherein the phase locked loop is controlled so that the first control signal is changed in accordance with the transmission data, and wherein the oscillation signal is further modulated after the first control signal is controlled in accordance with the transmission data.

[Supplementary Note 15]

The radio signal processing device according to supplementary note 12, wherein the variation detection unit detects the variation of the first control signal in a period before the oscillation signal is modulated by the transmission data.

[Supplementary Note 16]

The radio signal processing device according to supplementary note 12, wherein the power amplifier amplifies the oscillation signal output by the oscillator.

[Supplementary Note 17]

The radio signal processing device according to supplementary note 12, wherein the amplification factor of the power amplifier is controlled in accordance with the transmission data, and the amplitude of the radio transmission signal is further modulated in accordance with the transmission data.

[Supplementary Note 18]

The radio signal processing device according to supplementary note 1, wherein the phase locked loop is configured using an analog phase locked loop, and outputs the first control signal that is an analog voltage signal to the oscillator, and wherein the oscillator is configured as a voltage controlled oscillator controlled in accordance with the first control signal.

[Supplementary Note 19]

The radio signal processing device according to supplementary note 18, further comprising an analog-digital converter that converts the first control signal into a digital signal, wherein the variation detection unit monitors a change in the first control signal input through the analog-digital converter to detect the variation.

[Supplementary Note 20]

The radio signal processing device according to supplementary note 1, wherein the phase locked loop is configured as a digital phase locked loop, and outputs the first control signal that is a digital signal to the oscillator, and wherein the oscillator is configured as a digitally controlled oscillator controlled in accordance with the first control signal.

[Supplementary Note 21]

The radio signal processing device according to supplementary note 20, wherein the variation detection unit monitors the first control signal, and detects the variation on the basis of the magnitude of a change in the first control signal in a predetermined period of time.

[Supplementary Note 22]

The radio signal processing device according to supplementary note 4, wherein the variation detection unit includes a first comparator comparing the first control signal with a first threshold value and a second comparator comparing the first control signal with a second threshold value, and detects, as the first period of time, a period of time from the reference timing to the timing a comparison result indicating that the first control signal is equal to or larger than the first threshold value can be obtained in the first comparator, or a period of time from the reference timing to the timing a comparison result indicating that the first control signal is equal to or smaller than the second threshold value can be obtained in the second comparator.

[Supplementary Note 23]

The radio signal processing device according to supplementary note 1, wherein the resonance circuit further includes a fourth capacity unit whose capacitance value is changed in accordance with a fourth control signal, and the fourth control signal is adjusted so that the frequency of the oscillation signal becomes a predetermined frequency.

[Supplementary Note 24]

A semiconductor device comprising:

an oscillator that has a resonance circuit including an inductor, a first capacity unit whose capacitance value can be changed in accordance with a first control signal, and a second capacity unit whose capacitance value can be changed in accordance with a second control signal, and that outputs an oscillation signal having an oscillation frequency in accordance with the resonance frequency of the resonance circuit;

a phase locked loop that controls the oscillator by generating the first control signal to be output to the oscillator, and that allows the oscillator to output the oscillation signal in synchronization with a reference signal;

a power amplifier that amplifies a radio transmission signal on the basis of the oscillation signal;

a balun circuit that is arranged between the power amplifier and an antenna used for transmission of the radio transmission signal, includes an inductor, and converts a signal between a balanced signal and an unbalanced signal;

a variation detection unit that detects a variation with respect to the time change of the first control signal after the power amplifier starts an amplifying operation in a state where the phase locked loop controls the oscillation signal output by the oscillator at a predetermined frequency; and a variation correction unit that generates the second control signal on the basis of the variation detected by the variation detection unit, and outputs the generated second control signal to the oscillator so that the variation of the oscillation frequency caused by electromagnetic coupling between the inductor included in the resonance circuit and the inductor included in the balun circuit is corrected.

[Supplementary Note 25]

An oscillation frequency variation correction method, wherein the phase of an oscillation signal output by an oscillator having a resonance circuit including an inductor, a first capacity unit whose capacitance value can be changed in accordance with a first control signal, and a second capacity unit whose capacitance value can be changed in accordance with a second control signal is compared with the phase of a reference signal using a phase locked loop, the first control signal is generated on the basis of the comparison result, and the generated first control signal is input to the oscillator so that the oscillation signal in synchronization with the reference signal is output from the oscillator, wherein the electric power of a radio transmission signal on the basis of the oscillation signal is amplified in a state where the oscillation signal is controlled at a predetermined frequency using the phase locked loop, wherein a variation with respect to the time change of the first control signal input to the oscillator is detected after an amplifying operation of the electric power of the radio transmission signal is started, and wherein the second control signal is generated on the basis of the detected variation, and the generated second control signal is input to the oscillator so that the variation of the oscillation frequency of the oscillator caused by interference accompanied by the amplifying operation of the electric power of the radio transmission signal is corrected.

What is claimed is:

1. A radio signal processing device comprising:
  an oscillator that has a resonance circuit including an inductor, a first capacity unit whose capacitance value can be changed in accordance with a first control signal, and a second capacity unit whose capacitance value can be changed in accordance with a second control signal, and that outputs an oscillation signal having an oscillation frequency in accordance with the resonance frequency of the resonance circuit;
  a phase locked loop that controls the oscillator by generating the first control signal to be output to the oscillator, and that allows the oscillator to output the oscillation signal in synchronization with a reference signal;
  a variation detection unit that detects a variation with respect to the time change of the first control signal after a power amplifier causing interference with the resonance circuit starts an amplifying operation, the power amplifier amplifying a radio transmission signal on the basis of the oscillation signal in a state where the phase locked loop controls the oscillation signal output by the oscillator at a predetermined frequency; and
  a variation correction unit that generates the second control signal on the basis of the variation detected by the variation detection unit, and that corrects the variation of the oscillation frequency caused by the interference accompanied by the amplifying operation of the power amplifier by outputting the generated second control signal to the oscillator.

2. The radio signal processing device according to claim 1,
  wherein the variation correction unit changes the oscillation frequency so as to cancel the variation of the oscillation frequency caused by the interference of the power amplifier using the second control signal.

3. The radio signal processing device according to claim 1,
  wherein the first control signal has an upper limit value and a lower limit value for controlling, and the variation correction unit performs the correction so that the first control signal output by the phase locked loop to the oscillator becomes lower than the upper limit value and higher than the lower limit value after the correction is performed.

4. The radio signal processing device according to claim 1,
  wherein the variation detection unit detects a first period of time from the reference timing related to the start of the amplifying operation in the power amplifier to the time the first control signal reaches a predetermined threshold value.

5. The radio signal processing device according to claim 4,
  wherein the variation detection unit detects a slope with respect to the time change of the first control signal on the basis of the time until the first control signal reaches the predetermined threshold value and the predetermined threshold value.

6. The radio signal processing device according to claim 5,
  wherein the power amplifier is controlled so that the amplification factor is increased in a plurality of stages until the electric power of the radio transmission signal becomes a predetermined electric power, and
  wherein the variation correction unit estimates the variation amount of the oscillation frequency caused by the interference of the power amplifier on the basis of the slope detected by the variation detection unit, a second period of time from the reference timing to the completion timing of an increase in the amplification factor, and the change amount of the oscillation frequency with respect to a change in the first control signal in the oscillator.

7. The radio signal processing device according to claim 6,
  wherein the variation correction unit generates the second control signal on the basis of the variation amount of the estimated oscillation frequency and the change amount of the oscillation frequency with respect to the change amount of the second control signal in the oscillator.

8. The radio signal processing device according to claim 6,
  wherein the variation correction unit changes a relationship between the first control signal and the oscillation frequency in the oscillator by only the variation amount of the estimated oscillation frequency by outputting the generated second control signal to the oscillator.

9. The radio signal processing device according to claim 4,
  wherein the variation correction unit further has a table in which a value related to the correction amount of the correction is stored while being associated with the first period of time, obtains the value related to the correction amount in association with the first period of time detected by the variation detection unit from the table, and generates the second control signal on the basis of the obtained value related to the correction amount.

10. The radio signal processing device according to claim 1,
  wherein the second control signal is encoded using a thermometer code.

11. The radio signal processing device according to claim 1,
  wherein the oscillator outputs the oscillation signal with the phase or frequency modulated in accordance with transmission data.

12. The radio signal processing device according to claim 11,
  wherein the variation detection unit detects the variation of the first control signal in a period before the oscillation signal is modulated by the transmission data.

13. The radio signal processing device according to claim 11,
wherein the power amplifier amplifies the oscillation signal output by the oscillator.

14. The radio signal processing device according to claim 11,
wherein the amplification factor of the power amplifier is controlled in accordance with the transmission data, and the amplitude of the radio transmission signal is further modulated in accordance with the transmission data.

15. The radio signal processing device according to claim 1,
wherein the phase locked loop is configured using an analog phase locked loop, and outputs the first control signal that is an analog voltage signal to the oscillator, and
wherein the oscillator is configured as a voltage controlled oscillator controlled in accordance with the first control signal.

16. The radio signal processing device according to claim 1,
wherein the phase locked loop is configured as a digital phase locked loop, and outputs the first control signal that is a digital signal to the oscillator, and
wherein the oscillator is configured as a digitally controlled oscillator controlled in accordance with the first control signal.

17. The radio signal processing device according to claim 16,
wherein the variation detection unit monitors the first control signal, and detects the variation on the basis of the magnitude of a change in the first control signal in a predetermined period of time.

18. The radio signal processing device according to claim 1,
wherein the resonance circuit further includes a fourth capacity unit whose capacitance value is changed in accordance with a fourth control signal, and the fourth control signal is adjusted so that the frequency of the oscillation signal becomes a predetermined frequency.

19. A semiconductor device comprising:
an oscillator that has a resonance circuit including an inductor, a first capacity unit whose capacitance value can be changed in accordance with a first control signal, and a second capacity unit whose capacitance value can be changed in accordance with a second control signal, and that outputs an oscillation signal having an oscillation frequency in accordance with the resonance frequency of the resonance circuit;
a phase locked loop that controls the oscillator by generating the first control signal to be output to the oscillator, and that allows the oscillator to output the oscillation signal in synchronization with a reference signal;
a power amplifier that amplifies a radio transmission signal on the basis of the oscillation signal;
a balun circuit that is arranged between the power amplifier and an antenna used for transmission of the radio transmission signal, includes an inductor, and converts a signal between a balanced signal and an unbalanced signal;
a variation detection unit that detects a variation with respect to the time change of the first control signal after the power amplifier starts an amplifying operation in a state where the phase locked loop controls the oscillation signal output by the oscillator at a predetermined frequency; and
a variation correction unit that generates the second control signal on the basis of the variation detected by the variation detection unit, and outputs the generated second control signal to the oscillator so that the variation of the oscillation frequency caused by electromagnetic coupling between the inductor included in the resonance circuit and the inductor included in the balun circuit is corrected.

20. An oscillation frequency variation correction method,
wherein the phase of an oscillation signal output by an oscillator having a resonance circuit including an inductor, a first capacity unit whose capacitance value can be changed in accordance with a first control signal, and a second capacity unit whose capacitance value can be changed in accordance with a second control signal is compared with the phase of a reference signal using a phase locked loop, the first control signal is generated on the basis of the comparison result, and the generated first control signal is input to the oscillator so that the oscillation signal in synchronization with the reference signal is output from the oscillator,
wherein the electric power of a radio transmission signal on the basis of the oscillation signal is amplified in a state where the oscillation signal is controlled at a predetermined frequency using the phase locked loop,
wherein a variation with respect to the time change of the first control signal input to the oscillator is detected after an amplifying operation of the electric power of the radio transmission signal is started, and
wherein the second control signal is generated on the basis of the variation detected by the variation detection unit, and the generated second control signal is input to the oscillator so that the variation of the oscillation frequency caused by interference accompanied by the amplifying operation of the electric power of the radio signal is corrected.

* * * * *